United States Patent
Kanamura

(10) Patent No.: US 7,259,089 B2
(45) Date of Patent: Aug. 21, 2007

(54) SEMICONDUCTOR DEVICE MANUFACTURING METHOD THAT INCLUDES FORMING A WIRING PATTERN WITH A MASK LAYER THAT HAS A TAPERED SHAPE

(75) Inventor: Ryuichi Kanamura, Tokyo (JP)

(73) Assignee: Sony Corporation (JP)

( * ) Notice: Subject to any disclaimer, the term of this patent is extended or adjusted under 35 U.S.C. 154(b) by 249 days.

(21) Appl. No.: 11/032,015

(22) Filed: Jan. 11, 2005

(65) Prior Publication Data
US 2005/0158982 A1 Jul. 21, 2005

(30) Foreign Application Priority Data
Jan. 19, 2004 (JP) ............ P2004-010362

(51) Int. Cl.
*H01L 21/467* (2006.01)
(52) U.S. Cl. ............ 438/623; 438/638; 438/640; 438/736; 257/E21.579
(58) Field of Classification Search ........... 438/736
See application file for complete search history.

(56) References Cited

U.S. PATENT DOCUMENTS

| | | | |
|---|---|---|---|
| 6,514,867 B1* | 2/2003 | Hui et al. | 438/713 |
| 6,593,246 B1* | 7/2003 | Hasegawa et al. | 438/736 |
| 6,627,557 B2* | 9/2003 | Seta et al. | 438/717 |
| 6,743,712 B2* | 6/2004 | Park et al. | 438/637 |
| 2001/0046783 A1* | 11/2001 | Furusawa et al. | 438/736 |
| 2006/0166482 A1* | 7/2006 | Kanamura | 438/623 |

FOREIGN PATENT DOCUMENTS

| | | |
|---|---|---|
| JP | 11-045887 | 2/1999 |
| JP | 2000-150519 | 5/2000 |
| JP | 2001-044189 | 2/2001 |
| JP | 2001-077196 | 3/2001 |
| JP | 2001-156170 | 6/2001 |
| JP | 2002-124568 | 4/2002 |
| JP | 2003-297920 | 10/2003 |
| JP | 2003-303824 | 10/2003 |

OTHER PUBLICATIONS

"Integration of Cu/low-k Dual-Damascene Interconnects with a Porous PAE/SIOC Hybrid Structure for 65nm-node High Performance eDRAM", R. Kanamura et al, 2003 Symposium on VSI Technology Digest of Technical Papers, pp. 107-108 (2003).
Japanese Office Action; Application No.: 2004-010362; dated Jan. 23, 2007.

* cited by examiner

*Primary Examiner*—Stephen W. Smoot
(74) *Attorney, Agent, or Firm*—Rader Fishman & Grauer PLLC; Ronald P. Kananen

(57) ABSTRACT

A semiconductor device manufacturing method includes the steps of: forming first and second insulation films on a substrate provided with a first wiring; sequentially forming first to third mask layers on the second insulation film; forming a wiring groove pattern in the third mask layer; selectively processing the third mask layer, formed to project into the inside of the wiring groove pattern, into a tapered shape; forming a contact hole pattern in the second and first mask layer, and removing the tapered shape portions of the third mask layer; and forming wiring grooves in the second insulation film by etching using the third mask layer, and forming contact holes in the insulation film by etching using the second and first mask layers.

12 Claims, 6 Drawing Sheets

SEMICONDUCTOR DEVICE MANUFACTURING METHOD THAT INCLUDES FORMING A WIRING PATTERN WITH A MASK LAYER THAT HAS A TAPERED SHAPE

BACKGROUND OF THE INVENTION

The present invention relates to a semiconductor device manufacturing method by which it is possible to secure voltage resistance between conduction layers used for wiring, to miniaturize the wiring and to facilitate higher integration.

Attendant on miniaturization and higher integration of semiconductor devices, the delay of electrical signals due to the time constant of wiring becomes a serious problem. Therefore, for conduction layers used in a multi-layer wiring step, copper (Cu) wirings have come to be introduced in place of wirings formed by using aluminum (Al) based alloys. Unlike the metallic materials that have been used in the conventional multi-layer wiring structures such as aluminum, copper is difficult to pattern by dry etching. Therefore, there has been generally used the so-called groove wiring technology (for example, the Damascene process) in which wiring grooves are preliminarily formed between layers and then the grooves are filled with copper to form a wiring pattern. Particularly, the method in which contact holes and wiring grooves are preliminarily formed and then the contact holes and the wiring grooves are simultaneously filled with copper (for example, the dual Damascene process) is effective for reducing the number of steps (see, for example, Japanese Patent Laid-open No. Hei 11-045887).

In addition, since an increase in the wiring capacitance leads to a lowering in the speed of the device, fine multi-layer wiring by use of a low-dielectric-constant film as an inter-layer insulation film is indispensable. Examples of the material for the low-dielectric-constant inter-layer insulation film include not only fluorine-containing silicon oxide (FSG) having a dielectric constant of about 3.5 and having hitherto given comparatively good results but also low-dielectric-constant films having a dielectric constant of about 2.7. Examples of the low-dielectric constant films are organic silicon based polymers represented by polyaryl ethers (PAE) and inorganic materials represented by hydrogensilsesquioxane (HSQ) and methylsilsesquioxane (MSQ). In recent years, even introduction of materials provided with a dielectric constant of about 2.2 by making these exemplar materials porous has been tried.

The dual Damascene process, when applied to the low-dielectric-constant inter-layer insulation film, must be a process that can overcome the following technical restrictions.

First, since the composition of the low-dielectric-constant film is close to the composition of the resist used for patterning, the low-dielectric-constant film is liable to be damaged at the time of the resist removing process. Specifically, it is indispensable that the resist peeling treatment after etching is conducted by use of a resist mask, and the resist regenerating treatment in the case where a treated resist pattern does not fulfill the product specifications can be performed without damaging the low-dielectric-constant film.

Next, a problem exists in connection with the application to the so-called borderless structure in which the wiring and the contact holes do not have registration allowances. Attendant on the miniaturization of semiconductor devices, a processing process capable of coping with the borderless structure is a major premise, at least in the multi-layer wirings of 0.18 µm generation and the latter generations. Therefore, even in the case where simultaneous formation of wiring grooves and contact holes by the dual Damascene process is applied to the inter-layer insulation films including the low-dielectric-constant film, a process accompanied by little variations in the via resistance due to misregistration is indispensable.

Additionally, though an etching blocking film must be present near the bottom portions of wiring grooves in order to form the wiring grooves with good depth controllability, insertion of an etching blocking film with a comparatively high dielectric constant as an inter mediate layer leads to an increase in the inter-layer capacitance. Therefore, there is a demand for a dual Damascene process for a low-dielectric-constant film, inter-layer structure with which the increase in capacitance can be suppressed while controlling the formation of wiring grooves.

Dual Damascene processes completed while paying attention to the above-mentioned technical restrictions have been disclosed (see, for example, Japanese Patent Laid-open Nos. 2000-150519 and 2001-44189). In addition, the present inventor et al have devised a dual Damascene process for a low-dielectric-constant film inter-layer structure including an organic film using a three-layer hard mask, as a dual Damascene process for a low-dielectric-constant film inter-layer structure capable of coping with high-performance devices of the 90 nm generation and the latter generations (see, for example, R. Kanamura et al, "Integration of Cu/low-k Dual-Damascene Interconnects with a Porous PAE/SiOC Hybrid Structure for 65 nm-node High Performance eDRAM", 2003 Symposium on VSI Technology Digest of Technical Papers, pp. 107-108 (2003)).

Now, the problems involved in the case of applying the dual Damascene process to the design rules for fine wiring pitches of the 65 nm generation or the 45 nm generation will be described below, referring to FIGS. 6A to 6H.

As shown in FIG. 6A, on an under insulation film 611 formed on a substrate (not shown), a lower layer wiring 614 of a copper (Cu) film buried wiring structure in which a laminate film composed of an organic film 612 and a silicon oxide ($SiO_2$) film 613, for example, is used as an inter-layer insulation film is formed.

On the silicon oxide film 613, for example, a silicon carbide (SiC) film is formed as an oxidation preventive layer 615 for the Cu film covering the lower layer wiring 614, and a carbon-containing silicon oxide (SiOC) film 616 is formed on the oxidation preventive layer 615. Further, a polyaryl ether (PAE) film, for example, is formed as an organic film 617. Subsequently, a silicon oxide ($SiO_2$) film as a first mask layer 618, a silicon nitride (SiN) film as a second mask layer 619, and a silicon oxide ($SiO_2$) film as a third mask layer 620 are sequentially formed in a laminated form, and a resist pattern 621 for forming wiring grooves is formed on the third mask layer 620.

Next, as shown in FIG. 6B, the resist pattern 621 [see FIG. 6A] is used as an etching mask, and a wiring groove pattern 622 in the third mask layer 620 is formed by a dry etching method. Then, the resist pattern 621 is removed through appropriate after-treatments. Next, a resist pattern 623 for formation of a contact hole pattern is formed. The resist pattern 623 is so formed as to overlap, at least partly, the wiring groove pattern 622. The resist pattern 623 is formed to be aligned relative to the lower layer wiring 614 or the wiring groove pattern 622; in this case, a region 624 of the so-called borderless structure in relation to the wiring groove pattern 622 is generated due to misregistrations which can be generated on a lithography process basis or dispersions of the dimensions of the layers.

Subsequently, as shown in FIG. 6C, the resist pattern 623 [see FIG. 6B] is used as an etching mask, and contact holes 625 are formed in the third mask layer 620 and the second mask layer 619 and the first mask layer 618 by a dry etching method, and then the contact holes 625 are extended to the PAE film 617. Here, the resist pattern 623 can be removed simultaneously with the etching treatment of the PAE film 617. Additionally, the resist pattern 623 gradually recedes during the opening of the contact holes 625 in the PAE film 617, and it is possible to obtain a good opening shape due to the presence of the second mask 6layer 619 composed of silicon nitride.

Next, as shown in FIG. 6D, the third mask layer 620 provided with the wiring groove pattern 622 is used, and the wiring groove pattern 622 is extendedly formed in the second mask layer 619 by a dry etching method. In addition, in the etching step of the second mask layer 619 using the third mask layer 620, the SiOC film 616 exposed at bottom portions of the contact holes can be opened to an intermediate extent. Since the etching selectivity ratio (SiN/SiOC) relative to the SiOC film under the above-mentioned etching conditions can be set to be slightly less than 1, in the case of etching the second mask layer 619 of silicon nitride having a thickness of 50 nm, the contact holes 625 are extendedly formed in the SiOC film 616 in the manner of including a required over-etching amount, and are opened to a depth of about 80 nm.

Subsequently, as shown in FIG. 6E, the contact holes 625 are formed in the SiOC film 616 remaining between the contact hole layers. Here, the first mask layer 618 remaining in the wiring groove regions is simultaneously removed by use of the second mask layer 619 provided with the wiring groove pattern, whereby wiring grooves 629 are formed. In this instance, as shown in FIG. 6F, in the region where the contact holes 625 and the upper layer wiring grooves 629 are in a borderless structure and where the adjacent wiring grooves 629 are arranged in a minimum space, the inter-wiring space is locally narrowed. This corresponds to the PAE film 617 between the wiring groove 629 (on the left side in the figure) and the wiring groove 629 (on the right side in the figure).

Thereafter, the PAE film 617 remaining at bottom portions of the wiring grooves 629 is etched to extendingly form the wiring grooves 629, and the SiC film 615 present at bottom portions of the contact holes 625 extendedly formed is etched, whereby the contact holes 625 are further extended. Thus, a predetermined dual Damascene processing is completed. Then, the narrow space region generated due to misregisterations in the contact hole patterning and dispersions of the dimensions may be narrowed, but not widened, due to an increase of shoulder etch. Incidentally, the second mask layer 619 remaining outside the wiring groove regions is removed in the process of etching the SiC film 615 present at bottom portions of the contact holes 625.

Thereafter, etching debris remaining on side walls of the wiring grooves 629 and the contact holes 625 and the denatured copper layer at bottom portions of the contact holes 625 are cleaned by an after-treatment using an appropriate chemical liquid and a hydrogen annealing treatment. Then, as shown in FIG. 6G, a Ta film as a barrier metal layer 632 is formed, for example, by a sputtering method, and a copper (Cu) film 633 is built up by an electroplating method or a sputtering method, whereby the wiring grooves 629 and the contact holes 625 are filled with a conduction film.

Further, the portions unnecessary as wiring pattern, of the barrier metal layer 632 and the copper film 633 are removed by a chemical mechanical polishing (CMP) method. As a result, as shown in FIG. 6H, upper layer wirings 634 composed of the copper film 633 are formed, and a multi-layer wiring structure of a dual Damascene structure is obtained. In addition, like the lower layer wirings 614, an SiC film 635, for example, as an oxidation preventive layer is formed on the dual Damascene wirings 634. However, at the narrow space portions generated due to misregistrations in the patterning of the contact holes 625 or dispersions of the dimensions, regions 636 of unsatisfactory isolation between the wirings (for example, between the upper layer wiring 634 (on the left side in the figures) and the upper layer wiring 634 (on the right side in the figures)) are formed.

It has been confirmed that the multi-layer wiring produced by the dual Damascene process as above shows a lowering in the yield due to short-circuit defects between the wiring and the adjacent different-potential wiring, since the regions 636 of unsatisfactory isolation between the wirings are generated locally. It has also been found that even in the case where the different-potential wirings are isolated in the range of operation of the semiconductor device, initial defects due to insufficient dielectric strength and abrasion troubles may sometimes be generated in the case of an isolation width of 25 nm or below and in use conditions thereafter.

SUMMARY OF THE INVENTION

It is an object of the present invention to solve the problem that the miniaturization makes it difficult to secure a wiring spacing necessary for prevention of short-circuit defects between wirings through contact holes and for securing a dielectric strength.

A first factor of the reason for the above-mentioned difficulties is the reduction of the space between wirings. For example, the space between wirings is reduced to a minimum of about 100 nm, according to the design rule for the 65 nm generation, and a minimum of about 70 nm according to the design rule for the 45 nm generation. It is difficult in principle to improve the misregistrations in the lithography process while compensating for the reduction of the space.

A second factor of the reason for the above-mentioned difficulties is the fact that the reduction of the opening size of contact holes is at a very high level. In the ordinary lithography process, stable opening becomes conspicuously difficult when the opening size of contact holes is reduced to or below 120 nm. In addition, it is very difficult to secure the reliability of wiring regarding the metal burying process, a lowering in the resistance of contact holes, stress migration, and the like. Therefore, the final opening size tends to remain on the larger side, relative to the reduction ratio of the space between wirings, which makes it more difficult to secure the necessary space between wirings.

A third factor of the reason for the above-mentioned difficulties is the gradual lowering of the dielectric strength of the insulation films themselves, since the dielectric constant of the insulation films is lowered to in order to lower the wiring capacitance attendant to the miniaturization of wirings. Therefore, the voltage resistance limit width tends to become larger, which also makes it difficult to secure the necessary space between wirings.

In order to attain the above object, according to a first aspect of the present invention, a semiconductor device manufacturing method includes the steps of: laminating a first insulation film and a second insulation film on a substrate provided with a first wiring, to form an insulation film; sequentially laminating a first mask layer, a second mask layer, and a third mask layer on the insulation film; forming a wiring groove pattern for processing a wiring groove in the third mask layer; selectively processing into a tapered shape the third mask layer formed in the state of projecting to the inside of the wiring groove pattern; forming a contact hole pattern for forming a contact hole in the second mask layer and the first mask layer, and removing the tapered shape portion of the third mask layer; and forming a wiring groove pattern in the second mask layer and the first mask layer by etching using the third mask layer as an etching mask, forming a wiring groove in the second insulation film, and forming a contact hole in the insulation film by etching using the second mask layer and the first mask layer as an etching mask.

In accordance with a second aspect of the present invention, a semiconductor device manufacturing method includes the steps of: laminating a first insulation film and a second insulation film on a substrate provided with a first wiring, to form an insulation film; sequentially laminating a first mask layer, a second mask layer, and a third mask layer on the insulation film; forming a wiring groove pattern for processing a wiring groove in the third mask layer; forming a contact hole pattern for forming a contact hole in the second mask layer and the first mask layer, and selectively processing into a tapered shape the second mask layer formed in the state of projecting to the inside of the wiring groove; and forming a wiring groove pattern in the second mask layer and the first mask layer by etching using the third mask layer as an etching mask, forming a wiring groove in the second insulation film, and forming a contact hole in the insulation film by etching using the second mask layer and the first mask layer as an etching mask.

In accordance with a third aspect of the present invention, a semiconductor device manufacturing method includes the steps of: laminating a first insulation film and a second insulation film on a substrate provided with a first wiring, to form an insulation film; sequentially laminating a first mask layer and a second mask layer on the insulation film; forming a wiring groove pattern for processing a wiring groove in the second mask layer; forming a contact hole pattern in the second mask layer and the first mask layer by using a resist mask provided with a contact hole pattern for forming a contact hole, and selectively processing into a tapered shape the second mask layer formed in the state of projecting to the inside of the contact hole pattern in the resist mask; and forming a wiring groove pattern in the first mask layer by etching using the second mask layer as an etching mask, forming a wiring groove in the second insulation film, and forming a contact hole in the insulation film by etching using the first mask layer as an etching mask.

In each of the semiconductor device manufacturing methods, according to the present invention, the third mask layer or the second mask layer in the opening region of the contact hole, not covered by the wiring groove, is selectively processed into a tapered shape, so that the contact hole, not covered by the upper layer wiring, can be selectively reduced. Therefore, it is possible to prevent short-circuit defects from being generated between the wiring and the adjacent different-potential wiring.

BRIEF DESCRIPTION OF THE DRAWINGS

These and other objects of the invention will be seen by reference to the description, taken in connection with the accompanying drawings, in which.

DETAILED DESCRIPTION OF THE PREFERRED EMBODIMENTS

The object of the present invention is to provide a method of manufacturing a semiconductor device having a multi-layer wiring, high in performance, yield, and reliability, by preventing the short-circuit defects between the wiring and the different-potential wiring adjacent to a contact hole, without sacrificing the opening property and reliability of contact holes even in a miniaturized multi-layer wiring using a low-dielectric-constant film of the 65 nm generation and the latter generations. The above object is realized by preventing the short-circuit defects between the wiring and the adjacent different-potential wiring through selectively processing into a tapered shape a third mask in the contact hole opening regions not covered by wiring grooves and thereby selectively reducing the contact holes not covered by upper-layer wirings.

A first embodiment of the semiconductor device manufacturing method according to the present invention will be described referring to the manufacturing step sectional views (including plan layout views, partly) shown in FIGS. 1A and 2E.

Figure 1A:
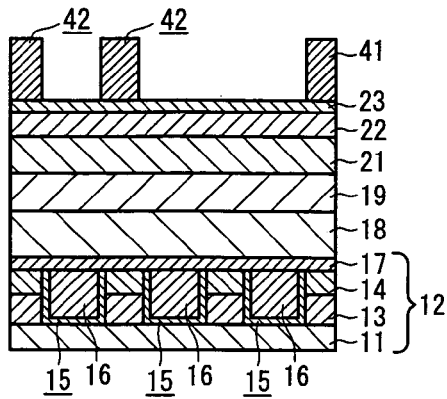
FIGS. 1A to 1H show manufacturing steps sectional views showing a first embodiment of the semiconductor device manufacturing method according to the present invention.

As shown in FIG. 1A, an inter-layer insulation film 12 is formed on an under insulation film 11 built up on a substrate (not shown). The inter-layer insulation film 12 is composed of a laminate film composed of an organic film 13 and a silicon oxide ($SiO_2$) film 14. The inter-layer insulation film 12 is provided with a first wiring 16 in wiring grooves 15, with a close contact layer, a metal barrier layer, and the like therebetween. The first wiring layer 16 is formed to have a wiring thickness of about 150 nm, by burying a copper (Cu) film, for example. In addition, an oxidation preventive layer 17 is formed on the first wiring 16. The oxidation preventive layer 17 is formed by forming, for example, a silicon carbide (SiC) film in a thickness of 35 nm.

Subsequently, a first insulation film 18 between contact holes is formed. As the first insulation film 18, a carbon-containing silicon oxide (SiOC) film was formed in a thickness of 135 nm. As one example of the method for forming the SiC film and the SiOC film, a parallel flat plate type plasma CVD apparatus was used. As a raw material gas in the formation steps, methylsilane was used as a silicon source in both cases. The film formation was conducted under the conditions of a substrate temperature of 300 to 400° C., a plasma power of 150 to 350 W, and a film forming atmosphere pressure of about 100 to 1000 Pa. It was possible to form the SiC film with a dielectric constant of about 3.8, and the SiOC film with a dielectric constant of about 2.6.

Next, a second insulation film 19 is formed on the first insulation film 18. As the second insulation film 19, an organic polymer with a dielectric constant of about 2.6 is built up. In this embodiment, a polyaryl ether (PAE) film was formed in a thickness of 110 nm, as one example. The organic polymer film can be formed by building up a precursor by a spin coating method, followed by a curing treatment at 350 to 450° C. Other examples, which can be used, include a benzocyclobutene (BCB) film, polyimide films, and an amorphous carbon film.

Subsequently, a first mask layer 21, a second mask layer 22, and a third mask layer 23 are sequentially formed on the second insulation film 19. Here, the first, second, and third mask layers 21, 22, and 23 are formed of light-transmitting materials; as one example, the first mask 21 was composed of an $SiO_2$ film in a thickness of 145 nm, the second mask layer 22 was composed of a silicon nitride (SiN) film in a thickness of 50 nm, and the third mask layer 23 was composed of an $SiO_2$ film in a thickness of 35 nm. Thereafter, a resist mask 41 for formation of wiring grooves is formed on the third mask layer 23. The resist mask 41 is provided with opening portions 42 for opening a wiring groove pattern.

The $SiO_2$ film, constituting the first mask layer 21, and the third mask layer 23 can be formed by a plasma CVD method using monosilane ($SiH_4$) as a silicon source (raw material gas) and dinitrogen monoxide ($N_2O$) gas as an oxidant. In the case where oxidation of the second insulation film 19, composed of a lower layer PAE film, is particulary a problem in forming the $SiO_2$ film, constituting the first mask layer 21, it is preferable to form a silicon oxide film which contains silicon in an amount in excess of the stoichiometric amount. The SiN film constituting the second mask layer 22 can be formed by the same plasma CVD apparatus as that for the $SiO_2$ film, using monosilane ($SiH_4$) as a silicon source (raw material gas), ammonia ($NH_3$) gas as a nitriding agent, dinitrogen monoxide ($N_2O$) gas as an oxidant, and an inert gas as a carrier gas.

Figure 1E:
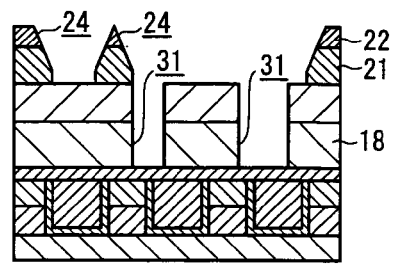
Figure 1B:
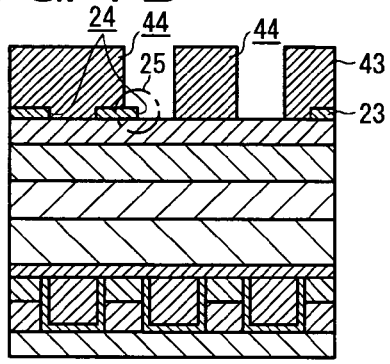

Next, as shown in FIG. 1B, dry etching is conducted using the resist mask 41 [see FIG. 1A] as an etching mask, whereby a wiring groove pattern 24 is formed in the third mask layer 23. The etching is conducted by an etching apparatus of the general magnetron system, using octafluorobutane ($C_4F_8$), carbon monoxide (CO), and argon (Ar) as an etching gas in a flow rate ratio ($C_4F_8$:CO:Ar) of 1:5:20, with a bias power of 1200 W and a substrate temperature of 20° C. An etching selectivity ratio ($SiO_2$/SiN) relative to the SiN film under the etching condition of not less than 0.10 can be obtained so that the SiN film constituting the underlying second mask layer 22 is little etched. In addition, after the etching of the third mask layer 23, for example, an ashing treatment with an oxygen ($O_2$) plasma as a base and a chemical treatment with an organic amine based chemical liquid are conducted, whereby the resist mask 41 and the debris deposits upon the etching treatment can be removed completely.

Next, a resist mask 43 for formation of a contact hole pattern is formed. The resist mask 43 is provided with opening portions 44 for forming contact holes. In addition, the resist mask 43 is so formed as to overlap, at least at a part thereof, the wiring groove pattern 24 in the third mask layer 23. Since the steps generated at the wiring groove pattern 24 in the third mask layer 23 can generally be suppressed to the film thickness of the third mask layer 23, about 35 nm, a good contact hole resist mask shape can be obtained with lithographic characteristics substantially the same as those in the case of patterning a flat portion. Additionally, even in the case of jointly using a coating type reflection preventive film (for example, BARC), variations in the burying shape of the reflection preventive film can be suppressed to a minute extent, depending on the dimensions and density of the third mask layer 23. It is possible to reduce the focal depth dispersions which would cause worsening of resist shape at the time of exposure treatment or variations of dimensions.

The resist mask 43, for formation of contact holes, is formed to be aligned relative to the first wiring 16 or the wiring groove pattern 24; in this case, regions 25, of borderless structure relative to the wiring groove pattern 24, are generated, due to misregistrations and dispersions of dimensions of the layers which might occur on the lithography process basis.

Figure 1F:
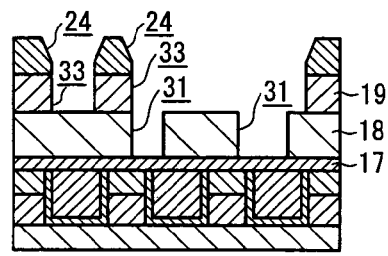
Figure 1C:
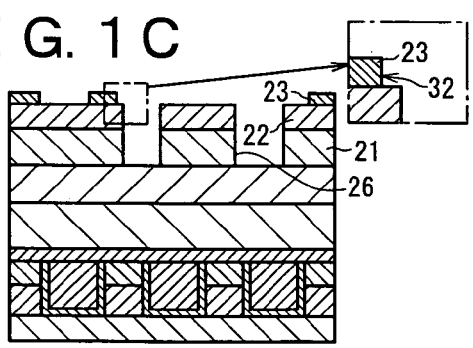

Next, as shown in FIG. 1C, a connection pattern 26 is formed in the third mask layer 23, the second mask layer 22, and the first mask layer 21 by a dry etching method using the resist mask 43 [see FIG. 1B] with the contact hole pattern as an etching mask. In this step, such a processing as to selectively reduce only the contact hole pattern 26, not covered by the wiring grooves, is conducted. The forming method will be described in detail, referring to FIGS. 2A to 2E.

Figure 2A:
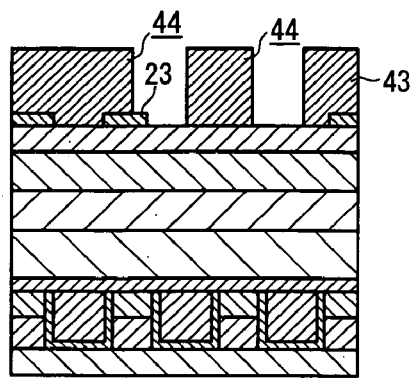
FIGS. 2A to 2E show manufacturing steps sectional views (including a plan layout view, partly) showing the first embodiment of the semiconductor device manufacturing method according to the present invention.

First, as shown in FIG. 2A, parts of the third mask layer 23 are exposed at bottom portions of the opening portions 44 in the resist mask 43. In this condition, as shown in FIG. 2B, the third mask layer 23 exposed at the bottom portions of the opening portions 44 in the resist mask 43 for formation of contact holes is etched into a tapered shape. This etching is conducted by an etching apparatus of the general magnetron system, using octafluorobutane ($C_4F_8$) and oxygen ($O_2$) as an etching gas with a gas flow rate ratio ($C_4Fe_8$:$O_2$) of 8:5, a bias power of 1000 W, and a substrate temperature of 20° C. Since an etching selectivity ratio ($SiO_2$/SiN) relative to the SiN film under the etching conditions of not less than 10 can be obtained, the SiN film of the underlying second mask layer 21 is little etched. In addition, the processed taper angle of the $SiO_2$ film under the etching conditions is about 50°. As a result, it is possible to obtain a reduction of about 20 nm, regarding the contact holes partly overlapping the wiring grooves formed by transferring the wiring groove pattern 24.

The reduction amount of the contact holes in the above-mentioned borderless structure can be arbitrarily regulated by varying the film thickness of the third mask layer 23 or the processed taper angle under the etching conditions for the third mask layer 23, i.e., the $SiO_2$ film. For example, as the $SiO_2$ film thickness of the third mask layer 23 is larger, the reduction amount can be set larger, even by etching with the equal taper angle. However, an increase in the film thickness of the $SiO_2$ film leads to an increase of the under steps in the resist patterning of the contact holes. Therefore, it is preferable to set the film thickness to be not more than 100 nm. If the film thickness of the $SiO_2$ film is too small, not only the reduction amount of the contact holes is reduced, but also the controllability in the processing of the wiring grooves in the SiN film of the second mask layer 22 is degraded. Therefore, it is preferable to set the film thickness to be not less than 25 nm. The processed taper angle of the $SiO_2$ film can be regulated by varying the gas flow rate ratio ($C_4F_8:O_2$). In this case, taking into account the reduction effect of the contact holes, it is preferable that the processed taper angle is not more than 80°. For obtaining an appropriate relative difference from the finished size of the contact holes which are not of the borderless structure, it is preferable that the processed taper angle is not less than 30°. The term "processed taper angle" means the angle of the inclined surface against the normal to the substrate surface, here and hereinafter.

Figure 2D:
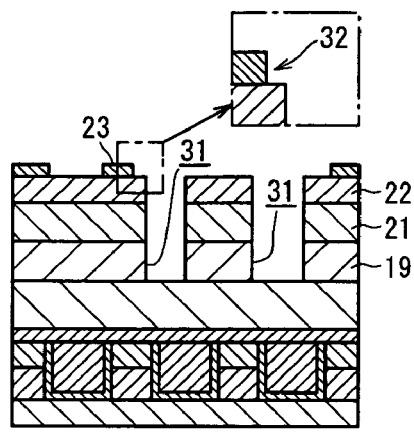
Figure 2B:
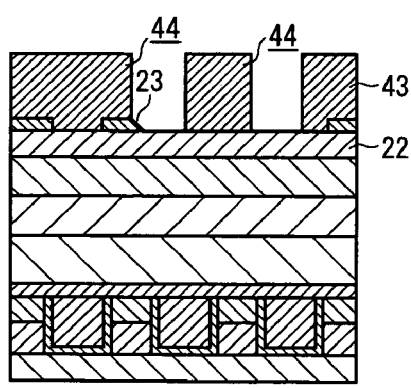
Figure 2E:
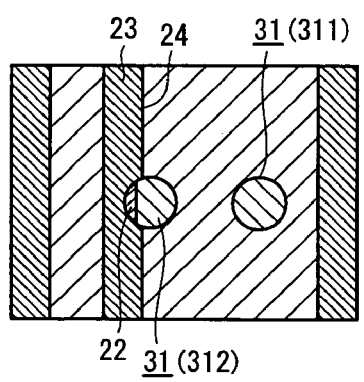
Figure 2C:
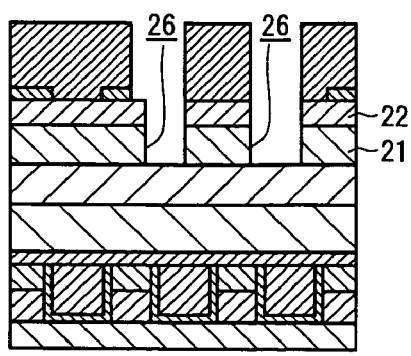

Subsequently, as shown in FIG. 2C, a contact hole pattern 26 is opened in the SiN film of the second mask layer 22 and the $SiO_2$ film of the first mask layer 21, in the contact hole opening regions. At the time of etching the first mask layer 21, the tapered portions [see FIG. 2B] of the third mask layer 23 are also etched away. The etching of the SiN film is conducted by an etching apparatus of the general magnetron system, using difluoromethane ($CH_2F_2$), oxygen ($O_2$), and argon (Ar) as an etching gas with a gas flow rate ratio ($CH_2F_2:O_2:Ar$) of 2:1:5, a bias power of 100 W, and a substrate temperature of 20° C. Since it is possible to obtain an etching selectivity ratio ($SiN/SiO_2$) relative to the $SiO_2$ film in the etching conditions of not less than 3, the $SiO_2$ film of the third mask layer 23 processed into the tapered shape and exposed to upper layers is scarcely made to recede.

Similarly, the etching of the $SiO_2$ film of the first mask layer 21 is conducted by an etching apparatus of the general magnetron system, using octafluorobutane ($C_4F_8$), carbon monoxide (CO), and argon (Ar) as an etching gas, with a gas flow rate ratio ($C_4F_8:CO:Ar$) of 1:5:20, a bias power of 1200 W, and a substrate temperature of 20° C. In this etching treatment, the $SiO_2$ film of the third mask layer 23 processed into the tapered shape and exposed to upper layers is also removed. In this case, it is possible to obtain an etching selectivity ratio ($SiO_2/SiN$) relative to the SiN film of not less than 10. Therefore, the SiN film of the underlying second mask layer 22 functions as an etching mask, and unrequired receding of the contact holes is restrained.

Next, as shown in FIG. 2D, an etching treatment is conducted by using the third mask layer 23, the second mask layer 22, the first mask layer 21, and the like as an etching mask, to thereby open contact holes 31 in the second insulation film 19 in the contact hole opening regions. Additionally, the resist pattern 43 [see FIG. 2B] can be removed at the time of etching the PAE film of the second insulation film 19.

The etching of the second insulation film 19, which is an organic film, and the resist mask 43 was conducted by an ordinary high-density plasma etching apparatus using ammonia ($NH_3$) as an etching gas. An RF power of 150 W and a substrate temperature of 20° C. were used. Since the etching rate of the resist under the etching conditions is roughly equal to the etching rate of the PAE, the resist pattern 43 recedes during the opening of the contact holes in the PAE film. However, the presence of the SiN film of the second mask layer 22 makes it possible to obtain a good contact hole opening shape. Incidentally, it is possible to obtain an etching selectivity ratio relative to the SiN film, the $SiO_2$ film, and the SiOC film under the etching conditions for the PAE film of not less than 100.

Additionally, as shown in the plan layout view in FIG. 2E, of the contact holes 31 formed by this step, the contact holes 31 (312) having regions partly not covered by the upper layer wiring groove pattern 24 are reduced by a maximum of about 20 nm, relative to the contact holes 31 (311) in the regions covered by the upper layer wiring groove pattern 24, in the same manner as in the case of processing the mask material. In addition, the reduction amount of the contact holes 312 varies depending on the dimensional dispersions and misregistration amounts of the contact holes and the upper layer wiring grooves. As the borderless regions are reduced, the reduction amount is also reduced. Finally, processed steps [see FIG. 2D] of the $SiO_2$ film constituting the third mask layer 23 are confirmed. Additionally, the processed steps 32 of the $SiO_2$ film are confirmed in the condition where the SiN film of the second mask layer 22 remains in a crescent shape in the inside of the contact holes 312.

Figure 1G:
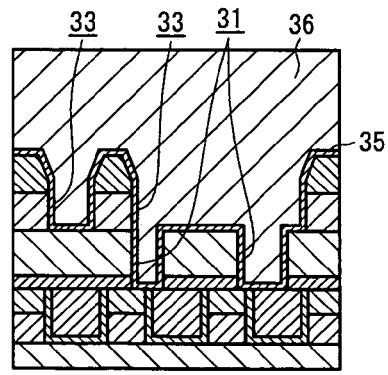
Figure 1D:
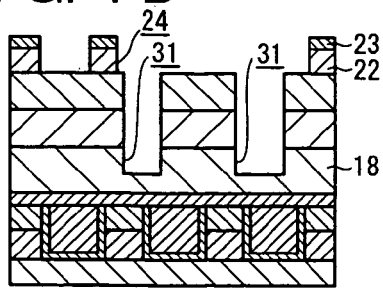

Next, as shown in FIG. 1D, the wiring groove pattern 24 is extendedly formed in the SiN film of the second mask layer 22 by a dry etching method using the third mask layer 23 provided with the wiring groove pattern 24 as an etching mask. The etching is conducted by an etching apparatus of the general magnetron system, using difluoromethane ($CH_2F_2$), oxygen ($O_2$), and argon (Ar) as an etching gas with a gas flow rate ratio ($CH_2F_2:O_2:Ar$) of 2:1:5 and a bias power of 100 W. Since it is possible to obtain a selectivity ratio ($SiN/SiO_2$) relative to the $SiO_2$ film under the etching conditions of about 3, the wiring groove pattern 24 can be opened in the second mask layer 22 with an allowance of thickness of 50 nm when the $SiO_2$ film of the third mask layer 23 is about 35 nm, for example.

In addition, in the etching step for the second mask layer 22 using the third mask layer 23, the wiring groove pattern 24 can be formed to penetrate through the second insulation film 19 composed of the organic film exposed at bottom portions of the contact holes 31 and to extend to an intermediate portion of the first insulation film 18 composed of the SiOC film. Since it is possible to obtain an etching selectivity ratio (SiN/SiOC) relative to the SiOC film under the etching conditions of slightly less than 1, in the case of etching the second mask layer 22 composed of the SiN film having a thickness of 50 nm, the first insulation film 18 composed of the SiOC film can be etched to a depth of 80 nm including the required over-etching amount.

Next, as shown in FIG. 1E, contact holes 31 are completely formed in the first insulation film 18 composed of the SiOC film. Here, the first mask layer 21 composed of the $SiO_2$ film remaining in the wiring groove regions is simultaneously removed, by using as an etching mask the second mask layer 22 composed of the SiN film provided with the wiring groove pattern 24. This etching is conducted by an etching apparatus of the general magnetron system, using octafluorocyclopentene ($C_5F_8$), carbon monoxide (CO), argon (Ar), and oxygen ($O_2$) as an etching gas with a gas flow rate ratio ($C_5F_8:CO:Ar:O_2$) of 1:10:5:1, a bias power of 1600 W, and a substrate temperature of 20° C. Since it is possible to obtain an etching selectivity ratio (SiOC/SiN) relative to the SiN film under the etching conditions of not less than 10, the about 50 nm portion of the SiOC film of the first insulation film 18 remaining at bottom portions of the contact holes can be sufficiently etched if the SiN film of the second mask layer 22 has a thickness of 50 nm, and it is possible to obtain a good opening shape while suppressing the upper side broadening of the wiring grooves and the shoulder etch, with a sufficient allowance.

Thereafter, as shown in FIG. 1F, the PAE film of the second insulation film 19 remaining at bottom portions of the wiring groove pattern 24 is etched to form wiring grooves 33, and the SiC film of the oxidation preventive film 17 present at bottom portions of the contact holes 31 is etched to further extendingly form the contact holes 31. As a result, the contact holes 31 reach the first wiring 16. In this manner, the predetermined so-called dual Damascene processing is completed. Incidentally, the SiN film of the second mask layer 22 remaining outside the wiring groove regions is removed during the process of etching the SiC film of the oxidation preventive layer 17 present at the bottom portions of the contact holes 31.

The formation of the wiring grooves 33 in the PAE film of the second insulation film 19 was conducted by using an ordinary high-density plasma etching apparatus with, for example, ammonia ($NH_3$) as an etching gas, an RF power of 150 W, and a substrate temperature of 20° C. Since it is possible to obtain an etching selectivity ratio relative to the SiOC film of the first insulation film 18 in the etching conditions of not less than 100, the opening of the wiring grooves 33 can be performed with good controllability without dispersions of depth.

The etching of the SiC film of the oxidation preventive layer 17 present at bottom portions of the contact holes 31 is conducted by an etching apparatus of the general magnetron system, using difluoromethane ($CH_2F_2$), oxygen ($O_2$), and argon (Ar) as an etching gas with a gas flow rate ratio ($CH_2F_2$:$O_2$:Ar) of 2:1:5 and a bias power of 100 W. It should be noted here that since the selectivity ratio relative to the SiOC film under the above-mentioned etching conditions is around 1, if the etching of the SiOC film present at bottom portions of the wiring grooves 33 is a problem, etching of the SiC film of the oxidation preventive layer 17 may be conducted before the opening of the wiring grooves 33 in the PAE film of the second insulation film 19. In addition, the SiN film of the second mask layer 22 remaining at upper portions of the inter-layer films (first and second insulation films 18 and 19) can be completely removed during the etching of the SiC film of the oxidation preventive layer 17.

Next, an after-treatment is conducted with an appropriate chemical liquid to clean the etching debris remaining on side walls of the wiring grooves and the contact holes, and an RF sputtering treatment is conducted to form a denatured Cu layer present at bottom portions of the contact holes. Thereafter, as shown in FIG. 1G, a Ta film as a barrier metal layer 35, for example, is built up on the inside surfaces of the wiring groves 33 and the contact holes 31 by a sputtering method. Though not shown in the figure, a copper seed layer is formed and a copper film 36 is built up by an electroplating method, or a copper film 36 is built up by a sputtering method. As a result, a conduction film of copper can be buried in the wiring grooves 33 and the contact holes 31. For the conduction film, metallic materials other than copper can also be used.

Figure 1H:
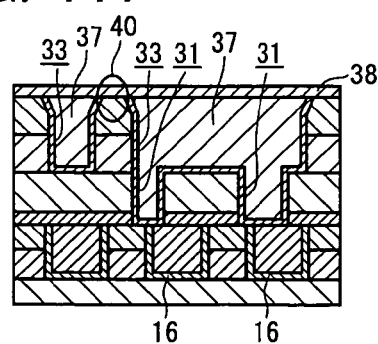

Further, of the copper film 36 and the barrier metal layer 35 thus built up, the portions unnecessary to the second wiring are removed by a chemical mechanical polishing (CMP) method, whereby as shown in FIG. 1H, the second wiring 37 is completed in the wiring grooves 33, and a part thereof is connected to the first wiring 16 through the contact holes 31. As a result, a multi-layer wiring structure of the so-called dual Damascene structure is obtained. The film thickness of the second wiring 37 constituting the final upper wiring is regulated to about 170 nm. In addition, in the same manner as in the case of the first wiring 16 of the lower layer wiring, an oxidation preventive layer 38 for covering the second wiring 37 is formed, for example, of an SiC film.

In the multi-layer wiring of the so-called dual Damascene structure, formed through the manufacturing steps of the first embodiment as above-described, only the contact holes 312 of the borderless structure are selectively reduced depending on the dispersions of the finished dimensions and misregistrations of the wiring grooves and the contact holes, whereby it is possible to prevent short-circuit defects between the wiring and the adjacent different-potential wiring and to secure a dielectric strength, in the regions 40. In addition, unnecessary reduction does not occur at the contact holes 311 in the regions that are not of the borderless structure and the contact holes with a little misregistration. Thus, it is possible to minimize the influences of the opening characteristics, the resistance characteristics at the contact holes, stress migration, and the like on the reliability of the wiring, as compared with the case of reducing the contact holes as a whole. Additionally, the semiconductor device manufactured through the multi-layer wiring process, including at least the above-described steps, could be obtained at a high yield.

Incidentally, the above-described various inter-layer insulation films are not limited to the above-mentioned kinds of films, film thicknesses, and forming methods. The oxidation preventive layers 17 and 38 composed of the Cu films may be SiN films formed by a CVD method, and may be a film containing light elements such as nitrogen ($N_2$) and hydrogen (H) in an SiC film.

The first and second insulation films 18 and 19, constituting the inter-layer films to be provided with the contact holes 31 and the wiring grooves 33, may be an SiOF film or $SiO_2$ film formed by a CVD method or a methylsilsesquioxane (MSQ) film or hydrogensilsesquioxane (HSQ) film formed by a spin coating method, for example, in place of the SiOC film. Additionally, it is possible to apply a polyallylene ether film, an amorphous carbon film, or a polytetrafluoroethylene film, in place of the PAE film. Furthermore, it is possible to apply a xerogel film, an MSQ film having a porous structure, an organic polymer, or the like or a combination thereof.

In addition, while the first to third mask layers 21 to 23 formed on the PAE film and the MSQ film have been respectively $SiO_2$/SiN/$SiO_2$ (35/50/145 nm) in this order from the upper side in the above description, the mask layers are not limited to the above-described details, inasmuch as the kinds of films, film thicknesses, and forming methods are so combined as to permit the lower layer mask being etched by using the upper layer mask. For example, the SiN film of the second mask layer 22 may be an SiC film or SiCN film, formed by a CVD method, and it can be thinned in the range permitted by the etching selectivity ratio. Similarly, the third mask 23, as the topmost layer, may be an amorphous silicon film formed by a sputtering method. In this case, the taper etching for reducing the contact holes of the borderless structure can be easily carried out under the etching conditions for the amorphous silicon film.

In this embodiment, the $SiO_2$ film constituting the first mask layer 21 is finally left in a thickness of about 50 nm between the wiring layers. However, if the adhesion property for adhesion to the barrier metal, the mechanical strength of copper in the CMP step, and the damage at the time of a reduction treatment of a copper oxide conducted before forming the oxidation preventive layer 38 for copper do not cause problems, the first mask layer 21 may be composed of an inorganic low-dielectric-constant film such as an SiOF film, an SiOC film, an HSQ film, etc. Additionally, the first mask layer 21 may be removed by the dual Damascene etching step or by the CMP step for copper, within the range permitted by the similar restrictions.

Second Embodiment

Now, a second embodiment of the semiconductor device manufacturing method according to the present invention will be described below, referring to the manufacturing step views (including plan layout views, partly) shown in FIGS. 3A and 4G. Incidentally, the same component parts as those in the first embodiment are denoted by the same symbols as used above.

Figure 3A:
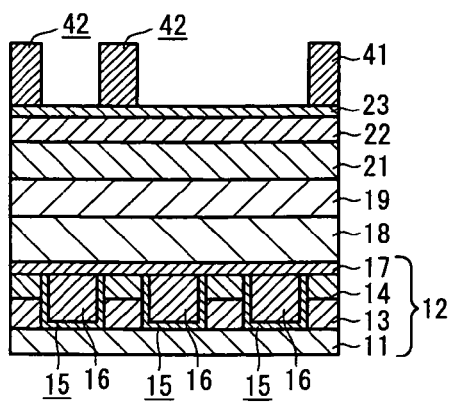
FIGS. 3A to 3H show manufacturing steps sectional views showing a second embodiment of the semiconductor device manufacturing method according to the present invention.

As shown in FIG. 3A, an inter-layer insulation film 12 is formed on an under insulation film 11 built up on a substrate (not shown). The inter-layer insulation film 12 is composed, for example, of a laminate film composed of an organic film 13 and a silicon oxide ($SiO_2$) film 14. The inter-layer insulation film 12 is provided with a first wiring 16 in wiring grooves 15, with a close contact layer, a barrier metal layer, and the like therebetween. The first wiring 16 is formed, for example, to have a wiring thickness of about 150 nm by burying a copper (Cu) film. In addition, an oxidation preventive layer 17 is formed on the first wiring 16. The oxidation preventive layer 17 is composed, for example, of a silicon carbide (SiC) film in a thickness of 35 nm.

Subsequently, a first insulation film 18 between contact hole layers is formed. As the first insulation film 18, a carbon-containing silicon oxide (SiOC) film was formed in a thickness of 135 nm. As one example of formation of the SiC film and the SiOC film, a parallel flat plate type plasma CVD apparatus was used, with methylsilane as a silicon source (raw material gas) in both cases. The film forming conditions are a substrate temperature of 300 to 400° C., a plasma power of 150 to 350 W, and a film forming atmosphere pressure of about 100 to 1000 Pa. It was possible to form the SiC film with a dielectric constant of about 3.8, and the SiOC film with a dielectric constant of about 2.6.

Next, a second insulation film 19 is formed on the first insulation film 18. As the second insulation film 19, a film of an organic polymer having a dielectric constant of about 2.6 is formed. In this embodiment, a polyaryl ether (PAE) film was formed in a thickness of 110 nm, as an example. The organic polymer can be formed by building up a precursor by a spin coating method, followed by a curing treatment at 350 to 450° C. Other examples, which can be used, include benzocyclobutene (BCB), polyimide films, and an amorphous carbon film.

Subsequently, a first mask layer 21, a second mask layer 22, and a third mask layer 23 are sequentially formed on the second insulation film 19. The first, second, and third mask layers 21, 22, and 23 are formed of light-transmitting materials. As an example, the first mask layer 21 was composed of an $SiO_2$ film in a thickness of 145 nm, the second mask layer 22 was composed of a silicon nitride (SiN) film in a thickness of 50 nm, and the third mask layer 23 was composed of an $SiO_2$ film in a thickness of 35 nm. Thereafter, a resist mask 41 for formation of wiring grooves is formed on the third mask layer 23. The resist mask 41 is provided with opening portions 42 for opening a wiring groove pattern.

The formation of the $SiO_2$ films constituting the first mask layer 21 and the third mask layer 23 can be conducted by a plasma CVD method using monosilane ($SiH_4$) as a silicon source (raw material gas) and dinitrogen monoxide ($N_2O$) as an oxidant. In the case where the oxidation of the second insulation film 19, composed of the lower layer PAE film, is particularly a problem in forming the $SiO_2$ film, constituting the first mask layer 21, it is preferable to form a silicon oxide film containing silicon in an amount in excess of the stoichiometric amount. The SiN film constituting the second mask layer 22 can be formed by a plasma CVD apparatus similar to that for the $SiO_2$ film, using monosilane ($SiH_4$) as a silicon source (raw material gas), ammonia ($NH_3$) gas as a nitriding agent, dinitrogen monoxide ($N_2O$) as an oxidant, and an inert gas as a carrier gas.

Figure 3B:
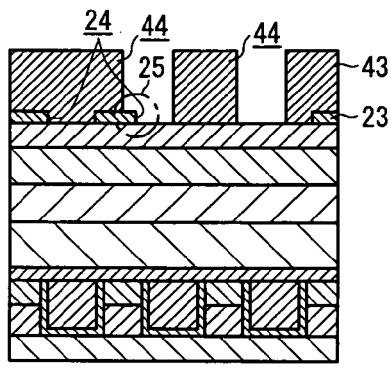

Next, as shown in FIG. 3B, a wiring groove pattern 24 is formed in the third mask layer 23 by dry etching using the resist mask 41 [see FIG. 3A] as an etching mask. This etching is conducted by an etching apparatus of the general magnetron system, using octafluorobutane ($C_4F_8$), carbon monoxide (CO), and argon (Ar) as an etching gas with a gas flow rate ratio ($C_4F_8$:CO:Ar) of 1:5:20, a bias power of 1200 W, and a substrate temperature of 20° C. Since it is possible to obtain an etching selectivity ratio ($SiO_2$/SiN) relative to the SiN film under the etching conditions of not less than 10, the SiN film of the underlying second mask layer 22 is little etched. After the etching of the third mask layer 23, an ashing treatment with an oxygen ($O_2$) plasma as a base and a chemical treatment with an organic amine based chemical liquid are conducted, whereby the resist mask 41 and debris remaining upon the etching treatment can be completely removed.

Next, a resist mask 43 for formation of a contact hole pattern is formed. The resist mask 43 is provided with opening portions 44 for formation of contact holes. The resist mask 43 is so formed as to overlap, at least partly, the wiring groove pattern 24 in the third mask layer 23. The steps generated in the wiring groove pattern 24 in the third mask layer 23 are generally suppressed to about 35 nm which is the film thickness of the third mask 23, so that it is possible to obtain a good contact hole resist mask shape with lithography characteristics substantially the same as those in the case of patterning a flat portion. Additionally, even in the case of jointly using a coating type reflection preventive film (for example, BARC), variations in the buried shape of the reflection preventive film can be suppressed to a minute level, depending on the dimensions and density of the third mask layer 23, so that it is possible to reduce the depth dispersions which would cause worsening of the resist shape at the time of exposure and variations of dimensions.

The resist mask 43 is so formed as to be aligned relative to the first wiring 16 or the wiring groove pattern 24. In this case, regions 25 of a borderless structure in relation to the wiring groove pattern 24 are generated, due to misregistrations and dimension dispersions of the layers, which might be generated on a lithography process basis.

Figure 3C:
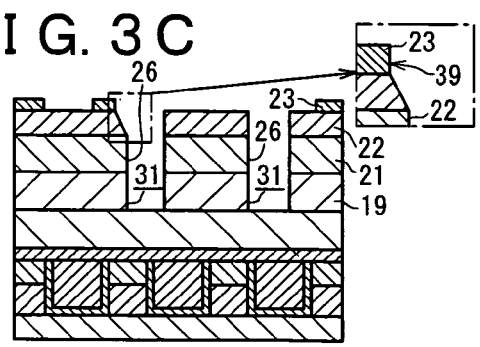

Next, as shown in FIG. 3C, a contact hole pattern 26 is formed in the third mask layer 23, the second mask layer 22, the first mask layer 21, and the second insulation film 19 by a dry etching method using the resist mask 43 [see FIG. 3B] with the contact hole pattern as an etching mask. Additionally, in this step, such a processing as to selectively reduce only the contact hole pattern 26 not covered by the upper layer wiring grooves is conducted. The forming method will be described in detail referring to FIGS. 4A to 4G.

Figure 4A:
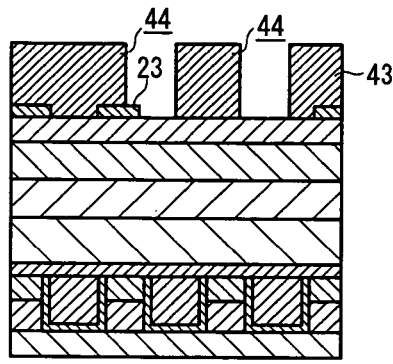
FIGS. 4A to 4G show manufacturing steps sectional views (including a plan layout view, partly) showing the second embodiment of the semiconductor device manufacturing method according to the present invention.
Figure 4B:
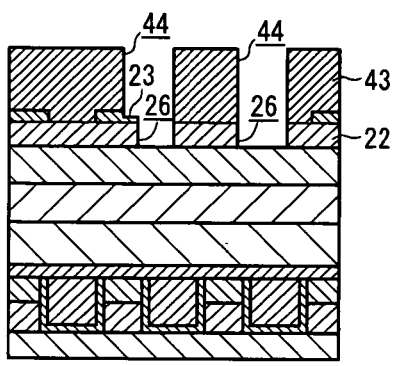

First, as shown in FIG. 4A, parts of the third mask layer 23 are exposed at the bottom portions of the opening portions 44 in the resist mask 43. In this condition, as shown in FIG. 4B, etching is conducted using, as an etching mask, the resist mask 43, for formation of the contact hole pattern and the third mask layer 23, exposed at bottom portions thereof. The second mask layer 22, exposed at bottom portions of the opening portions 44 in the resist mask 43, is etched to extendingly form the contact hole pattern 26. This etching is conducted by an etching apparatus of the general magnetron system, using difluoromethane ($CH_2F_2$), oxygen ($O_2$), and argon (Ar) as an etching gas with a gas flow rate ratio ($CH_2F_2$:$O_2$:Ar) of 2:1:5, and a bias power of 100 W. Since it is possible to obtain an etching selectivity ratio (SiN/$SiO_2$) relative to the $SiO_2$ film, in the etching conditions, of about 3, the contact hole pattern 26 can be opened in the SiN film of a thickness of 50 nm of the second mask layer 22 with a margin, if the SiO$_2$ film of the third mask layer 23 has a thickness of about 35 nm.

Figure 4C:
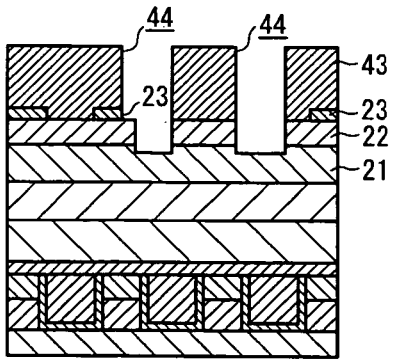

Subsequently, as shown in FIG. 4C, the SiO$_2$ film of the third mask layer 23, exposed at bottom portions of the opening portions 44 in the resist mask 43, is completely etched. This etching is conducted by an etching apparatus of the general magnetron system, using octafluorocyclopentene (C$_5$F$_8$), carbon monoxide (CO), argon (Ar), and oxygen (O$_2$) as an etching gas with a gas flow rate ratio (C$_5$F$_8$:CO:Ar:O$_2$) of 1:10:5:1, a bias power of 1600 W, and a substrate temperature of 20° C. Since it is possible to obtain an etching selectivity ratio (SiOC/SiN) relative to the SiN film in the etching conditions of not less than 10, the SiN film of the underlying second mask layer 22 is little etched. Additionally, an upper layer portion of the SiO$_2$ film of the underlying first mask layer 21 is also etched.

Figure 4D:
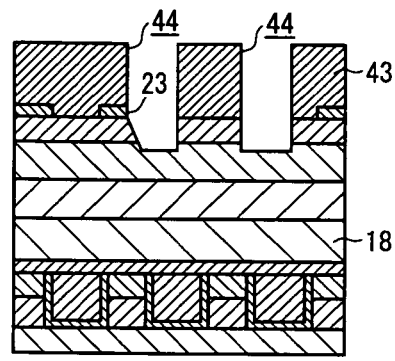

Thereafter, as shown in FIG. 4D, the SiN film of the second mask layer 22, exposed at the bottom portions of the opening portions 44 in the resist mask 43, is etched into a tapered shape. This etching is conducted by an etching apparatus of the general magnetron system, using difluoromethane (CH$_2$F$_2$) and oxygen (O$_2$) as an etching gas with a gas flow rate ratio (CH$_2$F$_2$:O$_2$) of 2:1, and a bias power of 500 W. The processed taper angle of the SiN film under the etching conditions is about 500 This makes it possible to reduce the contact holes of a borderless structure by about 20 nm, relative to the contact holes covered by the upper layer wiring grooves.

The reduction amount of the contact holes of the borderless structure can be arbitrarily regulated by varying the film thickness of the SiN film of the second mask layer 22 or the processed taper angle under the etching conditions for the SiN film. For example, as the thickness of the SiN film of the second mask layer 22 is larger, the reduction amount can be made larger through etching with the same taper angle. However, since an increase in the thickness of the SiN film makes it difficult to thereafter process the wiring grooves in the second mask layer 22, it is preferable to set the thickness to be not more than 100 nm. Additionally, if the second mask layer 22 is too thin, not only the reduction amount of the contact holes is reduced, but also the controllability of the opening of the contact hole pattern 26 in the SiO$_2$ film of the first mask layer 21, and the SiOC film of the first insulation film 18 is degraded. Therefore, it is preferable to set the thickness to be not less than 25 nm. Additionally, the processed taper angle of the SiN film of the second mask layer 22 can be regulated by varying the gas flow rate ratio (CH$_2$F$_2$:O$_2$) taking into account the reduction effect of the contact holes, the processed taper angle is preferably not more than 80°. In order to obtain an appropriate relative difference from the finished size of the contact holes, not being of the borderless structure, the taper angle is preferably not less than 30°.

Figure 4E:
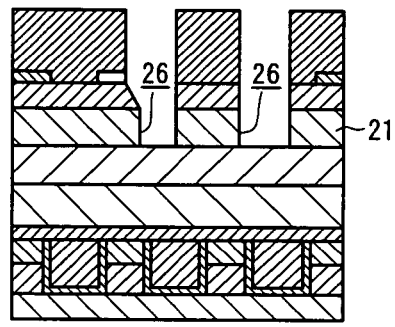

Subsequently, as shown in FIG. 4E, opening in the SiO$_2$ film of the first mask layer 21 in the contact hole opening regions is conducted, to form a contact hole pattern 26. The etching of the SiO$_2$ film is conducted by an etching apparatus of the general magnetron system, using octafluorobutane (C$_4$F$_8$), carbon monoxide (CO), and argon (Ar) as an etching gas with a gas flow rate ration (C$_4$F$_8$:CO:Ar) of 1:5:20, a bias power of 1200 W, and a substrate temperature of 20° C. Since it is possible to obtain an etching selectivity ratio (SiO$_2$/SiN) relative to the SiN film in the etching conditions of not less than 10, the SiN film processed into the tapered shape is scarcely made to recede.

Figure 4F:
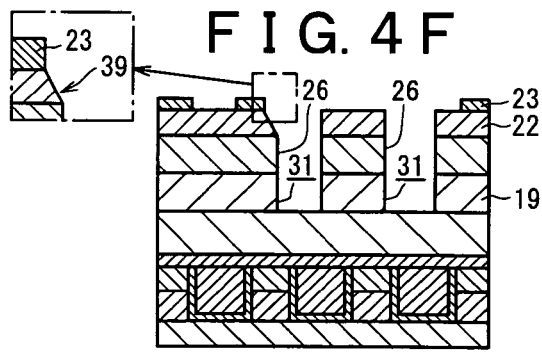

Next, as shown in FIG. 4F, contact holes 31 are opened in the second insulation film 19 present in the contact hole opening regions (contact hole pattern 26) by an etching treatment using the third mask layer 23, the second mask layer 22, and the like as an etching mask. In addition, the resist pattern 43 [see FIG. 4E] can be removed at the time of etching the PAE film of the second insulation film 19.

The second insulation film 19, which is an organic film, and the resist mask 43 [see FIG. 4D] were etched by use of an ordinary high-density plasma etching apparatus using ammonia (NH$_3$) as an etching gas with an RF power of 150 W and a substrate temperature of 20° C. Since the etching rate of the resist under the etching conditions is roughly equal to the etching rate of PAE, the resist pattern 43 gradually recedes during the opening in the PAE film of the second insulation film 19. However, the presence of the SiN film of the second mask layer 22 makes it possible to obtain a good contact hole opening shape. Incidentally, it is possible to obtain an etching selectivity ratio relative to the SiN film, the SiO$_2$ film, and SiOC film in the etching conditions for the PAE film of not less than 100.

Figure 4G:
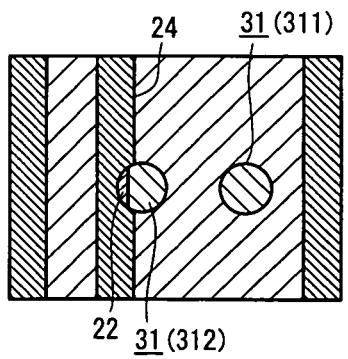

In addition, as shown in the plan layout view of FIG. 4G, of the contact holes 31, formed through this step, the contact holes 31 (312), having regions partly not covered by the upper layer wiring groove pattern 24, are reduced by a maximum of about 20 nm, relative to the contact holes 31 (311) in the regions covered by the upper layer wiring groove pattern 24, in the same manner as in the case of processing the mask material. Additionally, the reduction amount of the contact holes 312 varies depending on the dimension dispersions and misregistrations of the contact holes and the upper layer wiring grooves. In this case, as the borderless regions are reduced, the reduction amount is reduced. Finally, processed steps 39 [see FIG. 4F] of the SiN film of the second mask layer 22 are confirmed. The tapered shape 39 of the SiN film is confirmed in the condition where the SiN film of the second mask layer 22 is left in a crescent shape in the inside of the contact holes 312.

Figure 3D:
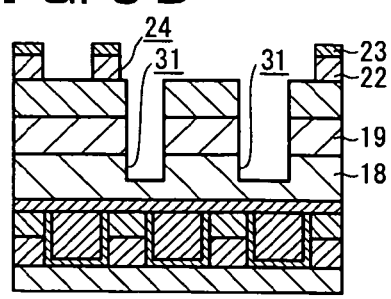

Next, as shown in FIG. 3D, the wiring groove pattern 24 is extendedly formed in the SiN film of the second mask layer 22 by a dry etching method using the third mask 23, provided with the wiring groove pattern 24 as an etching mask. This etching is conducted by an etching apparatus of the general magnetron system, using difluoromethane (CH$_2$F$_2$), oxygen (O$_2$), and argon (Ar) as an etching gas with a gas flow rate ratio (CH$_2$F$_2$:O$_2$:Ar) of 2:1:5, and a bias power of 100 W. Since it is possible to obtain a selectivity ratio (SiN/SiO$_2$) relative to the SiO$_2$ film, in the etching conditions, of about 3, it is possible to open the wiring groove pattern 24 in the second mask layer 22 with a margin of thickness of 50 nm, if the third mask SiO$_2$ film 20 is about 35 nm, for example.

Additionally, in the etching step for the second mask layer 22 using the third mask layer 23, the wiring groove pattern 24 can be so formed as to penetrate through the second insulation film 19, composed of an organic film exposed at bottom portions of the contact holes 31, and to extend to an intermediate portion of the first insulation film 18. Since it is possible to obtain an etching selectivity ratio (SiN/SiOC) relative to the SiOC film, in the etching conditions, of slightly less than 1, in the case of etching the second mask layer 22, composed of the SiN film having a thickness of 50 nm, the contact holes 31 formed in the first insulation film 18, composed of the SiOC film, is etched to a depth of 80 nm, inclusive of the required over-etching amount.

Figure 3E:
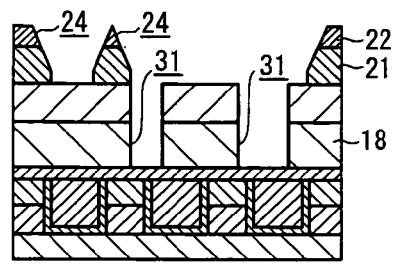

Next, as shown in FIG. 3E, the contact holes 31 are completely formed in the first insulation film 18 composed of the SiOC film. Here, the first mask layer 21, composed of the SiO$_2$ film remaining in the wiring groove regions, is simultaneously removed, by using the second mask layer, composed of the SiN film provided with the wiring groove pattern 24, as an etching mask. This etching is conducted, for example, by an etching apparatus of the general magnetron system, using octafluorocyclopentene ($C_5F_8$), carbon monoxide (CO), argon (Ar), and oxygen ($O_2$) as an etching gas with a gas flow rate ratio ($C_5F_8$:CO:Ar:$O_2$) of 1:10:5:1, a bias power of 1600 W, and a substrate temperature of 20° C. Since it is possible to obtain an etching selectivity ratio (SiOC/SiN) relative to the SiN film, under the etching conditions, of not less than 10, it is possible to sufficiently etch the about 50 nm portion of the SiOC film of the first insulation film 18 remaining at bottom portions of the contact holes if the SiN film of the second mask layer 22 has a thickness of 50 nm, and to obtain a good opening shape, while suppressing the upper side broadening of the wiring grooves or shoulder etch, with a sufficient margin.

Figure 3F:
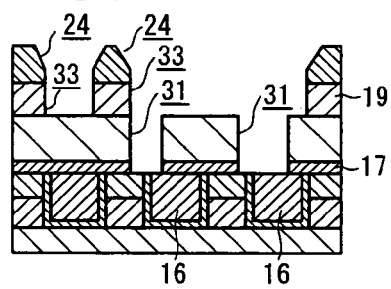

Thereafter, as shown in FIG. 3F, the PAE film of the second insulation film 19 remaining at bottom portions of the wiring groove pattern 24 is etched, to form wiring grooves 33, and the SiC film of the oxidation preventive layer 17, present at bottom portions of the contact holes 31, is etched, to further extendingly form the contact holes 31. As a result, the contact holes 31 reach the first wiring 16. In this manner, the predetermined so-called dual Damascene processing is completed. Incidentally, the SiN film of the second mask layer 22 remaining outside the wiring groove regions is removed during the process of etching the SiC film of the oxidation preventive layer 17, present at bottom portions of the contact holes 31.

The formation of the wiring grooves 33 in the PAE film of the second insulation film 19 was conducted by an ordinary high-density plasma etching apparatus using ammonia ($NH_3$) as an etching gas with an RF power of 150 W and a substrate temperature of 20° C. Since it is possible to obtain an etching selectivity ratio relative to the SiOC film of the first insulation film 18, under the etching conditions, of not less than 100, the opening of the wiring grooves 33 can be performed with good controllability without dispersions of depth.

The etching of the SiC film of the oxidation preventive layer 17, present at bottom portions of the contact holes 31, is conducted by an etching apparatus of the general magnetron system, using difluoromethane ($CH_2F_2$), oxygen ($O_2$), and argon (Ar) as an etching gas with a gas flow rate ratio ($CH_2F_2$:$O_2$:Ar) of 2:1:5, and a bias power of 100 W. It should be noted that the selectivity ratio relative to the SiOC film under the etching conditions is around 1, and that if the etching of the SiOC film, present at bottom portions of the wiring grooves 33, causes a problem, etching of the SiC film of the oxidation preventive layer 17 may be conducted before the opening of the wiring grooves 33 in the PAE film of the second insulation film 19. Additionally, the SiN film of the second mask layer 22 remaining at upper portions of the inter-layer films (first and second insulation films 18 and 19) can be completely removed during the etching of the SiC film of the oxidation preventive layer 17.

Figure 3G:
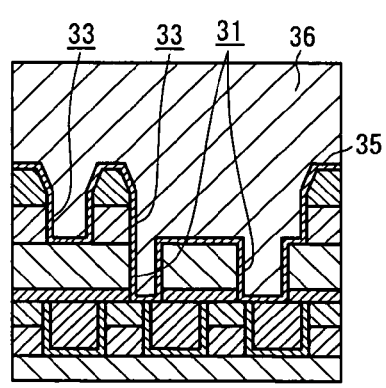

Next, an after-treatment is conducted with an appropriate chemical liquid to clean etching debris remaining on the side walls of the wiring grooves and the contact holes, and an RF sputtering treatment is conducted to form a denatured Cu layer present at bottom portions of the contact holes. Thereafter, as shown in FIG. 3G, a Ta film as a barrier metal layer 35, for example, is formed on the inside surfaces of the wiring grooves 33 and the contact holes 31 by a sputtering method. Though not shown in the figure, a copper seed layer is formed and a copper film 36 is built up by an electroplating method, or a copper film 36 is built up by a sputtering method. Thus, a copper conduction film can be buried in the wiring grooves 33 and the contact holes 31. As the conduction film, metallic materials other than copper can also be used.

Figure 3H:
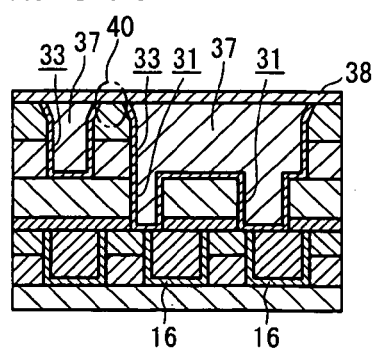

Further, of the copper film 36 and the barrier metal layer 35 thus built up, the portions unnecessary to the second wiring are removed by a chemical mechanical polishing (CMP) method, whereby, as shown in FIG. 3H, the second wiring 37 is completed in the wiring grooves 33, and a part thereof is connected to the first wiring 16 through the contact holes 31. The film thickness of the second wiring 37, constituting the final upper layer wiring, is regulated to be, for example, about 170 nm. In addition, in the same manner as in the case of the first wiring 16, as the lower layer wiring, an oxidation preventive layer 38 for covering the second wiring 37, is composed of an SiC film, for example.

In the multi-layer wiring of the so-called dual Damascene structure formed through the above-described manufacturing steps according to the second embodiment, only the contact holes 312 of the borderless structure are selectively reduced, according to dispersions of the finished sizes and misregistrations of the wiring grooves and the contact holes. It is possible to prevent the short-circuit defects between the wiring and the adjacent different-potential wiring and to secure a dielectric strength, in the regions 40. In addition, the contact holes 311 in the regions not of the borderless structure, and the contact holes with a little misregistration, are not reduced needlessly. Therefore, it is possible to minimize the influences of the opening characteristics, resistance characteristics at the contact holes, stress migration, and the like on the reliability of the wiring, as compared with the case of reducing the contact holes as a whole. In addition, the semiconductor device manufactured through the multi-layer wiring process, including at least the above-described steps, could be obtained at a high yield.

Incidentally, the above-described various inter-layer insulation films are not limited to the above-mentioned kinds of films, film thicknesses, and forming methods. The oxidation preventive layers 17 and 38, composed of Cu films, may be composed of SiN films formed by a CVD method, and may be films containing light elements such as nitrogen ($N_2$) and hydrogen (H) in SiC films.

As the first and second insulation films 18 and 19, functioning as the inter-layer films to be provided with the contact holes 31 and the wiring grooves 33, there may be used an SiOF film or $SiO_2$ film formed by a CVD method or a methylsilsesquioxane (MSQ) film or hydrogensilsesquioxane (HSQ) film formed by a spin coating method, in place of the SiOC film. It is possible to apply a polyallylene ether film, an amorphous carbon film, or a polytetrafluoroethylene film in place of the PAE film. Further, it is possible to apply a xerogel film, an MSQ film having a porous structure, an organic polymer, etc., or a combination thereof.

While the first to third mask layers 21 to 23, formed on the PAE film and the MSQ film, have been sequentially $SiO_2$/SiN/$SiO_2$ (35/50/145 nm), in this order from the upper side, they are not limited to the above-described details inasmuch as the kinds of films, film thicknesses, and forming methods are so combined as to permit etching of the lower layer mask by use of the upper layer mask. For example, the SiN film of the second mask layer 22 may be substituted by an SiC film or SiCN film, formed by a CVD method, and can be thinned within the range permitted by the etching selectivity ratio. Similarly, the third mask layer 23, as the topmost layer, may be an amorphous silicon film formed by a sputtering method. In this case, the taper etching for reducing the contact holes of the borderless structure can be easily carried out under the etching conditions for the amorphous silicon film.

In this embodiment, the $SiO_2$ film constituting the first mask layer 21 is finally left in a thickness of about 50 nm between the wiring layers. However, if the adhesion property for adhesion to the barrier metal, the mechanical strength of copper in the CMP step, or the damage at the time of a reduction treatment of a copper oxide conducted before forming the oxidation preventive layer 38 for copper would not be a problem, the first mask layer 21 may be composed of an inorganic low-dielectric-constant film such as an SiOF film, an SiOC film, an HSQ film, etc. In addition, the first mask layer 21 can be removed also by the dual Damascene etching step or by the CMP step for copper, within the range permitted by the similar restrictions.

Third Embodiment

Now, a third embodiment of the semiconductor device manufacturing method, according to the present invention, will be described below, referring to the manufacturing step sectional views shown in FIGS. 5A to 5H. Incidentally, the same component parts as those in the first embodiment are denoted by the same symbols as used above. In this third embodiment, a manufacturing method using a dual Damascene process of the two-layer hard mask system is shown.

Figure 5A:
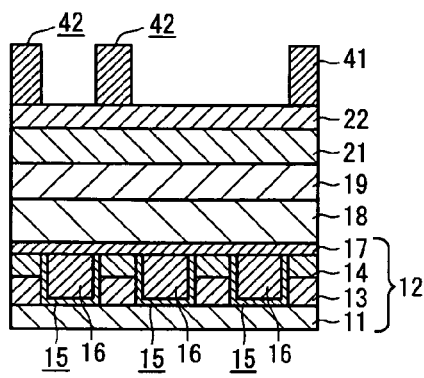
FIGS. 5A to 5H show manufacturing steps sectional views showing a third embodiment of the semiconductor device manufacturing method according to the present invention.

As shown in FIG. 5A, an inter-layer insulation film 12 is formed on an under insulation film 11 built up on a substrate (not shown). The inter-layer insulation film 12 is composed, for example, of a laminate film composed of an organic film 13 and a silicon oxide ($SiO_2$) film 14. The inter-layer insulation film 12 is provided with a first wiring 16 in wiring grooves 15, with a close contact layer, a barrier metal layer, and the like therebetween. The first wiring 16 is formed, for example, by burying a copper (Cu) film so as to have a wiring thickness of about 150 nm. In addition, an oxidation preventive layer 17 is formed on the first wiring 16. The oxidation preventive layer 17 is formed, for example, by forming a silicon carbide (SiC) film in a thickness of 35 nm.

Subsequently, a first insulation film 18 between contact holes layers is formed. The first insulation film 18 was formed by forming a carbon-containing silicon oxide (SiOC) film in a thickness of 135 nm. As one example of the method of forming the SiC film and the SiOC film, a parallel flat plate type plasma CVD apparatus was used, with methylsilane as a silicon source (raw material gas) in both cases, under the conditions of a substrate temperature of 300 to 400° C., a plasma power of 150 to 350 W, and a film forming atmosphere pressure of about 100 to 1000 Pa. It was possible to form the SiC film with a dielectric constant of about 3.8, and the SiOC film with a dielectric constant of about 2.6.

Next, a second insulation film 19 is formed on the first insulation film 18. As the second insulation film 19, a film of an organic polymer having a dielectric constant of about 2.6 is formed. In this embodiment, a polyaryl ether (PAE) film was formed in a thickness of 110 nm, as an example. The organic polymer can be formed by building up a precursor by a spin coating method, followed by a curing treatment at 350 to 450° C. Other materials which can be used include benzocyclobutene (BCB), polyimide films, an amorphous carbon film, etc.

Subsequently, a first mask layer 21 and a second mask layer 22 are sequentially formed on the second insulation film 19. Here, the first and second mask layers 21 and 22 are formed of light-transmitting materials. As one example, the first mask layer 21 was composed of an $SiO_2$ film with a thickness of, for example, 145 nm, and the second mask layer 22 was composed of a silicon carbide (SiC) film with a thickness of 35 nm. Thereafter, a resist mask 41 for formation of wiring grooves is formed on the second mask layer 22. The resist mask 41 is provided with opening portions 42 for opening a wiring groove pattern.

The formation of the $SiO_2$ film for constituting the first mask layer 21 can be conducted by a plasma CVD method using monosilane ($SiH_4$) as a silicon source (raw material gas), and dinitrogen monoxide ($N_2O$) as an oxidant. In the case where the oxidation of the second insulation film 19, composed of the lower layer PAE film, is particularly a problem in forming the $SiO_2$ film, constituting the first mask layer 21, it is preferable to form a silicon oxide film containing silicon in an amount in excess of the stoichiometric amount. The SiC film constituting the second mask layer 22 is formed by a plasma CVD apparatus similar to that for the $SiO_2$ film, using methylsilane as a silicon source (raw material gas) under the conditions of a substrate temperature of 300 to 400° C., a plasma power of 150 to 350 W, and a film forming atmosphere pressure of about 100 to 1000 Pa.

Figure 5B:
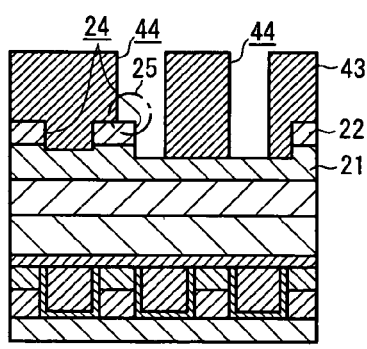

Next, as shown in FIG. 5B, a wiring groove pattern 24 is formed in the second mask layer 22 by dry etching using the resist mask 41 [see FIG. 5A] as an etching mask. This etching is conducted by an etching apparatus of the general magnetron system, using difluoromethane ($CH_2F_2$), oxygen ($O_2$), and argon (Ar) as an etching gas with a gas flow rate ratio ($CH_2F_2:O_2:Ar$) of 2:1:5, and a bias power of 100 W. Since the selectivity ratio ($SiC/SiO_2$) relative to the $SiO_2$ film in the etching conditions is about 1.5, the $SiO_2$ film of the underlying first mask layer 21 is etched by about 20 nm in the case of stably opening an arbitrary pattern having different wiring widths. After the etching of the second mask layer 22, for example, an ashing treatment, with an oxygen ($O_2$) plasma as a base, and a chemical treatment, with an organic amine based chemical liquid, are conducted, whereby the resist mask 41 and debris remaining upon the etching treatment can be completely removed.

Next, a resist mask 43 for formation of a contact hole pattern is formed. The resist mask 43 is provided with opening portions 44 for formation of contact holes. In addition, the resist mask 43 is so formed as to at least partly overlap the wiring groove pattern 24 in the second mask layer 22. Additionally, the steps generated at the wiring groove pattern 24 in the second mask layer 22 is roughly equal to the film thickness of about 50 nm, so that the formation of the pattern is somewhat more difficult than in the case of patterning a flat portion. However, it is possible to obtain a good contact hole resist pattern shape with lithography characteristics similar to those in the case of patterning a flat portion.

The resist mask 43 for formation of contact holes is so formed as to be aligned relative to the first wiring 16 or the wiring groove pattern 24. In this case, regions 25 of a borderless structure relative to the wiring groove pattern 24 are generated, due to the misregistrations and dimension dispersions of the layers, which might be generated on a lithography process basis.

Figure 5C:
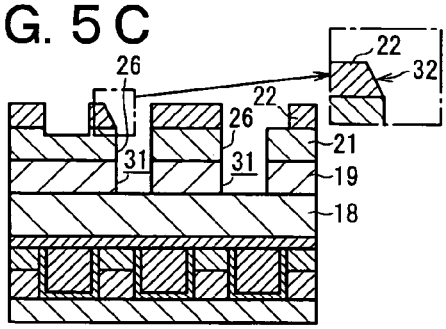

Next, as shown in FIG. 5C, a contact hole pattern 26 is formed in the second mask layer 22 and the first mask layer 21, and contact holes 31 are formed in the second insulation film 19 by a dry etching method using a resist mask 43 [see FIG. 5B] with the contact hole pattern as an etching mask. Additionally, in this step, such a processing, as to selectively reduce only the contact holes 31 not covered by the upper layer wiring grooves, is conducted. In addition, the resist pattern 43 [see FIG. 5B] can be removed at the time of etching the PAE film of the second insulation film 19.

The processing for forming the contact holes 31 is conducted as follows. First, the second mask layer 22, exposed at bottom portions of the opening portions 44 in the resist mask 43 for formation of the contact holes, is etched into a tapered shape. This etching is conducted by an etching apparatus of the general magnetron system, using difluoromethane ($CH_2F_2$), and oxygen ($O_2$) as an etching gas with a gas flow rate ratio ($CH_2F_2:O_2$) of 2:1, and a bias power of 500 W. The processed taper angle of the SiC film under the etching conditions is about 500 Thus, it is possible to achieve a reduction by about 20 nm, regarding the contact holes partly overlapping the wiring grooves formed by transferring the wiring groove pattern 24.

The reduction amount of the contact holes in the borderless structure can be arbitrarily regulated by varying the film thickness of the second mask layer 22 or the processed taper angle under the etching conditions of the second mask layer 22, i.e., the SiC film. For example, as the SiC film of the second mask layer 22 is thicker, the reduction amount can be made larger with the etching of the same taper angle. However, an increase in the film thickness of the SiC film leads to an increase in the under steps in the resist patterning for the contact holes. Therefore, the film thickness is preferably not more than 100 nm. In addition, if the SiC film is too thin, not only the reduction amount of the contact holes is reduced, but also the controllability of processing of the $SiO_2$ film of the first mask layer 21, and the SiOC film of the first insulation film 18 is degraded. Therefore, the film thickness is preferably not less than 25 nm. The processed taper angle of the SiC film can be regulated by varying the gas flow rate ratio ($CH_2F_2:O_2$). Taking into account the reduction effect of the contact holes, the taper angle is preferably not more than 80°. For obtaining an appropriate relative difference from the finished size of the contact holes not of the borderless structure, the taper angle is preferably not less than 30°.

Subsequently, a contact hole pattern 26 is opened in the $SiO_2$ film of the first mask layer 21 present in the contact hole opening regions. The etching of the $SiO_2$ film is conducted by an etching apparatus of the general magnetron system, using octafluorobutane ($C_4F_8$), carbon monoxide (CO), and argon (Ar) as an etching gas with a gas flow rate ratio ($C_4F_8:CO:Ar$) of 1:5:20, a bias power of 1200 W, and a substrate temperature of 20° C. Since it is possible to obtain an etching selectivity ratio ($SiC/SiO_2$) relative to the $SiO_2$ film under the etching conditions of not less than 15, the SiC film of the second mask layer 22, processed into the tapered shape and exposed to the upper layers, is scarcely made to recede.

Figure 5D:
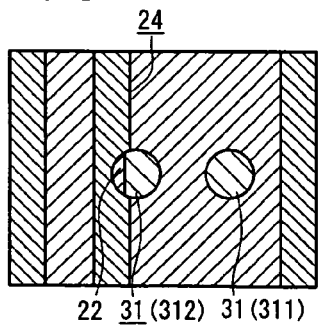

In addition, as shown in the plan layout view of FIG. 5D, of the contact holes 31 formed through this step, the contact holes 31 (312), having regions partly not covered by the upper layer wiring grooves, are reduced by a maximum of about 20 nm relative to the contact holes 31 (311) in the regions covered by the upper layer wiring grooves, in the same manner as in the case of processing the mask material. Additionally, the reduction amount of the contact holes 312 varies depending on the dimension dispersions and misregistrations of the contact holes and the upper layer wiring grooves. As the borderless regions are reduced, the reduction amount is also reduced. Finally, processed steps 32 [see FIG. 5C] at the SiC film of the second mask layer 22 are confirmed. The processed steps 32 at the $SiO_2$ film are confirmed in the condition where the SiC film of the second mask layer 22 is left in a crescent shape in the inside of the contact holes 312.

Figure 5E:
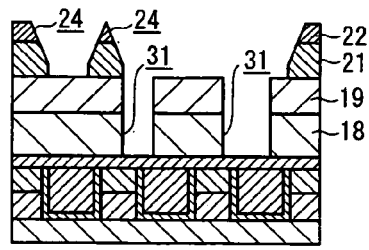

Next, as shown in FIG. 5E, the contact holes 31 are opened in the first insulation film 13 present in the contact hole opening regions by an etching treatment using the second mask layer 22, the first mask layer 21, and the like as an etching mask.

The etching of the second insulation film 19, composed of the organic film, and the resist mask 43 was conducted by an ordinary high-density plasma etching apparatus using ammonia ($NH_3$) as an etching gas under the conditions of an RF power of 150 W and a substrate temperature of 20° C. Since the etching rate of the resist under the etching conditions is roughly equal to the etching rate of PAE, the resist pattern 43 gradually recedes during the opening of the contact holes 31 in the PAE film of the second insulation film 19. However, the presence of the SiC film of the second mask layer 22 makes it possible to obtain a good contact hole opening shape. Incidentally, it is possible to obtain an etching selectivity ratio relative to the SiC film, the $SiO_2$ film, and the SiOC film, under the etching conditions for the PAE film, of not less than 100.

Next, the wiring groove pattern 24 is extendedly formed in the $SiO_2$ film of the first mask layer 21 by a dry etching method using the second mask layer 22 provided with the wiring groove pattern 24 as an etching mask. The etching is conducted by an etching apparatus of the general magnetron system, using octafluorocyclopentene ($C_5F_8$), carbon monoxide (CO), argon (Ar), and oxygen ($O_2$) as an etching gas with a gas flow rate ratio ($C_5F_8:CO:Ar:O_2$) of 1:10:5:1, a bias power of 1600 W, and a substrate temperature of 20° C. Since the etching selectivity ratio (SiOC/SiC) relative to the SiC film under the etching conditions is about 15, the SiOC film of the first insulation film 18, having a thickness of about 135 nm, remaining at bottom portions of the contact holes 31 can be etched to obtain a good opening shape while suppressing the upper broadening or shoulder etch of the wiring grooves if the film thickness of the second mask layer 22 is not less than 35 nm. However, the operation is more difficult than that in the cases of the three-layer hard mask system in the first and second embodiments. Therefore, there is need for sufficient optimization inclusive of the etching time.

Figure 5F:
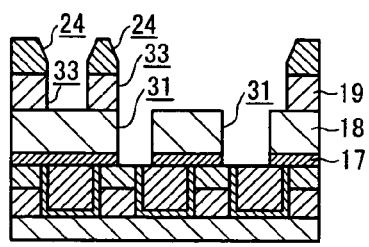

Thereafter, as shown in FIG. 5F, the PAE film of the second insulation film 19 remaining at bottom portions of the wiring groove pattern 24 is etched, to form wiring grooves 33, and the SiC film of the oxidation preventive layer 17 present at bottom portions of the contact holes 31 is etched, to further extendingly form the contact holes 31. As a result, the contact holes 31 reach the first wiring 16. In this manner, the predetermined so-called dual Damascene processing is completed. Incidentally, the SiC film of the second mask layer 22 remaining outside the wiring groove regions is removed during the process of etching the SiC film of the oxidation preventive layer 17 at bottom portions of the contact holes 31.

The formation of the wiring grooves 33 in the PAE film of the second insulation film 19 was conducted by an ordinary high-density plasma etching apparatus using ammonia ($NH_3$) as an etching gas under the conditions of an RF power of 150 W and a substrate temperature of 20° C. Since it is possible to obtain an etching selectivity ratio relative to the SiOC film of the first insulation film 18 in the etching conditions of not less than 100, the opening of the wiring grooves 33 can be performed with good controllability without dispersions of depth.

The etching of the SiC film of the oxidation preventive layer 17 present at bottom portions of the contact holes 31 is conducted by an etching apparatus of the general magnetron system, using difluoromethane ($CH_2F_2$), oxygen ($O_2$), and argon (Ar) as an etching gas with a gas flow rate ratio ($CH_2F_2:O_2:Ar$) of 2:1:5, and a bias power of 100 W. It should be noted here that the selectivity ratio relative to the SiOC film under the etching conditions is around 1, so that, if the etching of the SiOC film at bottom portions of the wiring grooves 33 is a problem, etching of the SiC film of the oxidation preventive layer 17 may be conducted before the opening of the wiring grooves 33 in the PAE film of the second insulation film 19. In addition, the SiN film of the second mask layer 22 remaining at upper portions of the inter-layer films (first and second insulation films 18 and 19) can be completely removed during the etching of the SiC film of the oxidation preventive layer 17.

Figure 5G:
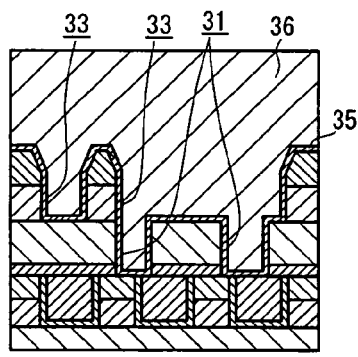

Next, an after-treatment is conducted with an appropriate chemical liquid to clean the etching debris remaining on the side walls of the wiring grooves and the contact holes, and an RF sputtering treatment is conducted to form a denatured Cu layer at bottom portions of the contact holes. Thereafter, as shown in FIG. 5G, for example, a Ta film, as a barrier metal layer 35, is formed on the inside surfaces of the wiring grooves 33 and the contact holes 31 by a sputtering method. Though not shown in the figure, a copper seed layer is formed and a copper film 36 is built up by an electroplating method, or a copper film 36 is built up by a sputtering method. Thus, it is possible to bury a copper conduction film in the wiring grooves 33 and the contact holes 31. As the conduction film, metallic materials other than copper can also be used.

Figure 5H:
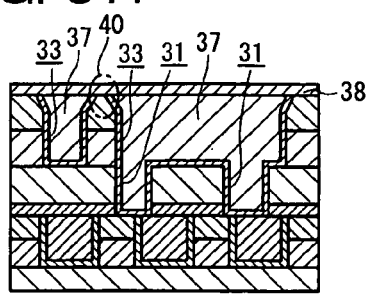
Figure 6A:
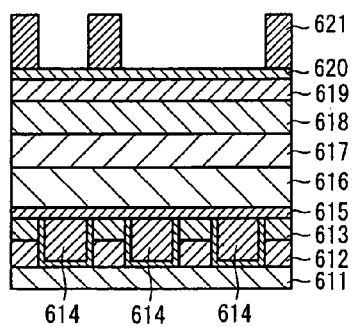
FIGS. 6A to 6H show manufacturing steps sectional views showing a method of manufacturing a multi-layer wiring structure of a semiconductor device according to the related art.
Figure 6B:
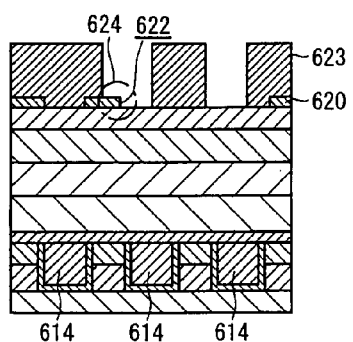
Figure 6C:
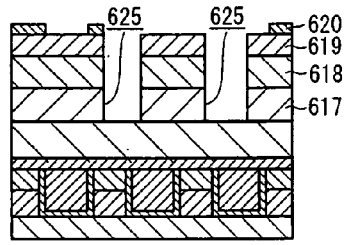
Figure 6D:
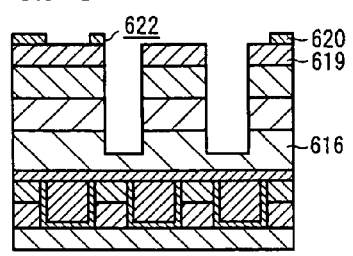
Figure 6E:
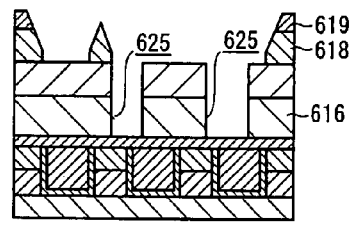
Figure 6F:
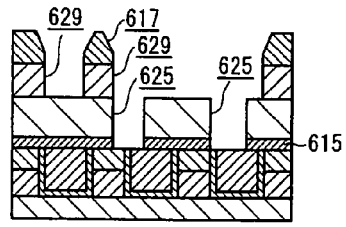
Figure 6G:
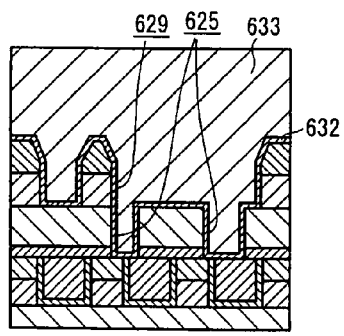
Figure 6H:
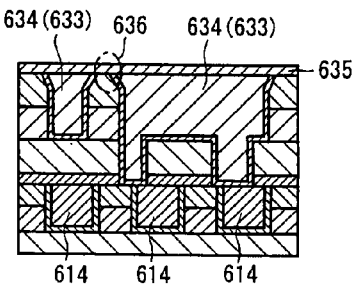

Further, of the copper film 36 and the barrier metal layer 35 thus built up, the portions unnecessary to the second wiring are removed by a chemical mechanical polishing (CMP) method, whereby as shown in FIG. 5H, a second wiring 37 is completed in the wiring grooves 33, and a part thereof is connected to the first wiring 16 through the contact holes 31. As a result, a multi-layer wiring structure of the so-called dual Damascene structure can be obtained. The film thickness of the second wiring 37, constituting the final upper layer wiring, is regulated to be about 170 nm, for example. In addition, in the same manner as in the case of the first wiring 16, constituting the lower layer wiring, an oxidation preventive layer 38 for covering the second wiring 37 is formed by forming, for example, an SiC film.

In the multi-layer wiring of the so-called dual Damascene structure formed through the above-described manufacturing steps according to the third embodiment, only the first contact holes 312 of the borderless structure are selectively reduced, depending on the dispersions of the finished dimensions and misregistrations of the wiring grooves and the contact holes, whereby it is possible to prevent the short-circuit defects between the wiring and the adjacent different-potential wiring and to secure a dielectric strength, in the regions 40. In addition, the contact holes 311 in the regions not of the borderless structure and the contact holes with a little misregistration are not reduced needlessly, which makes it possible to minimize the influences of the opening characteristics, resistance characteristics at the contact holes, stress migration, and the like on the reliability of the wiring, as compared with the case of reducing the contact holes as a whole. Additionally, the semiconductor device manufactured through the multi-layer wiring process including at least the above-described steps could be obtained at a high yield.

Incidentally, the above-described various inter-layer insulation films are not limited to the above-mentioned kinds of films, film thicknesses, and forming methods. The oxidation preventive layers 17 and 38 composed of Cu films may be SiN films formed by a CVD method, or may be films containing light elements such as nitrogen ($N_2$) and hydrogen (H) in SiC films.

The first and second insulation films 18 and 19, constituting the inter-layer films to be provided with the contact holes 31 and the wiring grooves 33, may be composed of an SiOF film or $SiO_2$ film formed by a CVD method or a methylsilsesquioxane (MSQ) film or hydrogensilsesquioxane (HSQ) film formed by a spin coating method, in place of the SiOC film. It is possible to apply a polyallylene film, an amorphous carbon film, or a polytetraethylene film in place of the PAE film. Further, it is possible to apply a xerogel film, an MSQ film having a porous structure, an organic polymer, or the like or a combination thereof.

In addition, while the first and second mask layers 21 and 22, formed on the PAE film and the MSQ film, have been SiC/$SiO_2$ (35/145 nm) in this order from the upper side, they are not limited to the above-described details, inasmuch as the kinds of films, film thicknesses, and forming methods are so combined as to permit etching of the lower layer mask by use of the upper layer mask. For example, the SiC film of the second mask layer 22 can be substituted by an SiN film or SiCN film formed by a CVD method, within the range permitted by the etching selectivity ratio.

Additionally, it is possible to adopt a laminate structure composed of an $SiO_2$ film as the upper layer second mask layer 22 and an SiC film as the lower layer first mask layer 21. If an increase in the wiring capacitance is permitted, it is possible to finally leave the SiC film on the PAE film. In this case, the tapering is applied to the upper layer $SiO_2$ film, and the etching is conducted by an etching apparatus of the general magnetron system which has been described in the first embodiment, using octafluorobutane ($C_4F_8$), and oxygen ($O_2$) as an etching gas with a gas flow rate ratio ($C_4F_8:O_2$) of 8:5, a bias power of 1000 W, and a substrate temperature of 20° C.

In this embodiment, the $SiO_2$ film constituting the first mask layer 21 is finally left in a thickness of about 50 nm between the wiring layers. However, if the close contact property for contact with the barrier metal, the mechanical strength in the CMP step for copper, or damage at the time of the reduction treatment of copper oxide, conducted before forming the oxidation preventive layer 38 for copper, is not a problem, it is possible to compose the first mask layer 21 of an inorganic low-dielectric-constant film such as an SiOF film, an SiOC film, and an HSQ film. In addition, the first mask layer 21 can also be removed in the dual Damascene etching step or in the CMP step for copper, within the range permitted by the similar restrictions.

Additionally, in each of the embodiments 1, 2, and 3, in the case of using the first mask layer 21 formed on the second insulation film 19 of the organic insulation film as a protective layer, for example, the first mask layer 21 may be composed of an SiOC film optimized as to carbon content, or the three layers of the first, second, and third mask layers 21, 22, and 23 or the two layers of the first mask layer 21 and the second mask layer 22 may be composed of a laminate structure of SiOC films differing in carbon content, whereby it is possible to easily carry out the dual Damascene processing by use of the laminate etching mask. This ensures that in the case of using the first mask layer 21 formed on the second insulation film 19 of the organic insulation film as a protective layer, it is possible to provide the first mask layer 21 with a lower dielectric constant, thereby reducing the wiring capacitance and enhancing the operating speed of the semiconductor device.

As has been described above, in the semiconductor device manufacturing method according to the present invention, it is possible to provide a method of manufacturing a semiconductor device that is fine and of a high degree of integration and has a multi-layer wiring with high performance, high yield, and high reliability.

The semiconductor device manufacturing method, according to the present invention, is preferable for application to uses of multi-layer wiring for various semiconductor integrated circuits.

While preferred embodiments of the invention have been described using specific terms, such description is for illustrative purposes only, and it is to be understood that changes and variations may be made without departing from the spirit or scope of the following claims.

What is claimed is:

1. A semiconductor device manufacturing method comprising the steps of:
   laminating a first insulation film and a second insulation film on a substrate provided with a first wiring, to form an insulation film;
   sequentially laminating a first mask layer, a second mask layer, and a third mask layer on said insulation film;
   forming a wiring groove pattern for processing a wiring groove in said third mask layer;
   selectively processing into a tapered shape said third mask layer formed in the state of projecting to the inside of said wiring groove pattern;
   forming a contact hole pattern for forming a contact hole in said second mask layer and said first mask layer, and removing said tapered shape portion of said third mask layer; and
   forming a wiring groove pattern in said second mask layer and said first mask layer by etching using said third mask layer as an etching mask, forming a wiring groove in said second insulation film, and forming a contact hole in said insulation film by etching using said second mask layer and said first mask layer as an etching mask.

2. The semiconductor device manufacturing method as set forth in claim 1, wherein
   said first, second, and third mask layers are formed of such materials that a mask layer immediately beneath an upper mask layer can be selectively etched by using said upper mask layer.

3. The semiconductor device manufacturing method as set forth in claim 1, wherein
   the step of processing said third mask layer into said tapered shape includes to process the processed taper angle in the range of 30° to 80°.

4. The semiconductor device manufacturing method as set forth in claim 1, wherein
   said first insulation film is composed of a carbon-containing silicon oxide film, and
   said second insulation film is composed of an organic film.

5. A semiconductor device manufacturing method comprising the steps of:
   laminating a first insulation film and a second insulation film on a substrate provided with a first wiring, to form an insulation film;
   sequentially laminating a first mask layer, a second mask layer, and a third mask layer on said insulation film;
   forming a wiring groove pattern for processing a wiring groove in said third mask layer;
   forming a contact hole pattern for forming a contact hole in said second mask layer and said first mask layer, and selectively processing into a tapered shape said second mask layer formed in the state of projecting to the inside of said wiring groove; and
   forming a wiring groove pattern in said second mask layer and said first mask layer by etching using said third mask layer as an etching mask, forming a wiring groove in said second insulation film, and forming a contact hole in said insulation film by etching using said second mask layer and said first mask layer as an etching mask.

6. The semiconductor layer manufacturing method as set forth in claim 5, wherein
   said first, second, and third mask layers are formed of such materials that a mask layer immediately beneath an upper mask layer can be selectively etched by using said upper mask layer.

7. The semiconductor device manufacturing method as set forth in claim 5, wherein
   the step of processing said second mask layer into said tapered shape includes to process the processed taper angle in the range of 30° to 80°.

8. The semiconductor device manufacturing method as set forth in claim 5, wherein
   said first insulation film is composed of a carbon-containing silicon oxide film, and
   said second insulation film is composed of an organic layer.

9. A semiconductor device manufacturing method comprising the steps of:
   laminating a first insulation film and a second insulation film on a substrate provided with a first wiring, to form an insulation film;
   sequentially laminating a first mask layer and a second mask layer on said insulation film;
   forming a wiring groove pattern for processing a wiring groove in said second mask layer;
   forming a contact hole pattern in said second mask layer and said first mask layer by using a resist mask provided with a contact hole pattern for forming a contact hole, and selectively processing into a tapered shape said second mask layer formed in the state of projecting to the inside of said contact hole pattern in said resist mask; and
   forming a wiring groove pattern in said first mask layer by etching using said second mask layer as an etching mask, forming a wiring groove in said second insulation film, and forming a contact hole in said insulation film by etching using said first mask layer as an etching mask.

10. The semiconductor device manufacturing method as set forth in claim 9, wherein
    said first and second mask layers are formed of such materials that said first mask layer can be selectively etched by using said second mask layer.

11. The semiconductor device manufacturing method as set forth in claim 9, wherein
    the step of processing said second mask layer includes to process the processed taper angle in the range of 30° to 80°.

12. The semiconductor device manufacturing method as set forth in claim 9, wherein
    said first insulation film is composed of a carbon-containing silicon oxide film, and
    said second insulation film is composed of an organic film.

* * * * *